(12) United States Patent
Kito et al.

(10) Patent No.: US 7,812,396 B2
(45) Date of Patent: Oct. 12, 2010

(54) SEMICONDUCTOR DEVICE WITH CHANNEL LAYER COMPRISING DIFFERENT TYPES OF IMPURITIES

(75) Inventors: Masaru Kito, Kanagawa (JP); Hideaki Aochi, Kanagawa (JP); Ryota Katsumata, Kanagawa (JP); Masaru Kidoh, Kanagawa (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 207 days.

(21) Appl. No.: 11/688,449

(22) Filed: Mar. 20, 2007

(65) Prior Publication Data

US 2008/0017922 A1    Jan. 24, 2008

(30) Foreign Application Priority Data

Jul. 24, 2006   (JP) .............................. 2006-201132

(51) Int. Cl.
   *H01L 23/62*   (2006.01)
(52) U.S. Cl. ................... 257/347; 257/204; 257/202; 257/E21.209; 257/E21.679; 257/E29.3; 257/E21.103
(58) Field of Classification Search .............. 257/347, 257/204, E21.209, E21.679, E29.3, E27.103, 257/202
   See application file for complete search history.

(56) References Cited

U.S. PATENT DOCUMENTS

| 6,136,650 | A | 10/2000 | Lee |
| 6,593,624 | B2 | 7/2003 | Walker |
| 6,624,011 | B1 | 9/2003 | Subramanian et al. |
| 6,737,675 | B2 | 5/2004 | Patel et al. |
| 6,841,813 | B2 | 1/2005 | Walker et al. |
| 2002/0028541 | A1* | 3/2002 | Lee et al. ................. 438/149 |
| 2003/0030074 | A1* | 2/2003 | Walker et al. ............. 257/204 |
| 2003/0209739 | A1* | 11/2003 | Hisamoto et al. .......... 257/278 |
| 2005/0070060 | A1 | 3/2005 | Walker et al. |
| 2005/0079675 | A1 | 4/2005 | Ilkbahar et al. |

FOREIGN PATENT DOCUMENTS

JP        11-312809        9/1999

* cited by examiner

*Primary Examiner*—Kimberly D Nguyen
*Assistant Examiner*—Mohammad T Karimy
(74) *Attorney, Agent, or Firm*—Banner & Witcoff, Ltd

(57) ABSTRACT

A semiconductor device having a first semiconductor region and second semiconductor region including impurities formed on an insulating layer formed on a semiconductor substrate, an insulator formed between the first semiconductor region and the second semiconductor region, a first impurity diffusion control film formed on the first semiconductor region and a second impurity diffusion control film formed on the second semiconductor region, a channel layer formed on the first impurity diffusion control film and second impurity diffusion film to cross at right angles with a direction where the first semiconductor region and the second semiconductor region are extended, a gate insulating film formed on the channel layer and a gate electrode formed on the gate insulating layer.

8 Claims, 23 Drawing Sheets

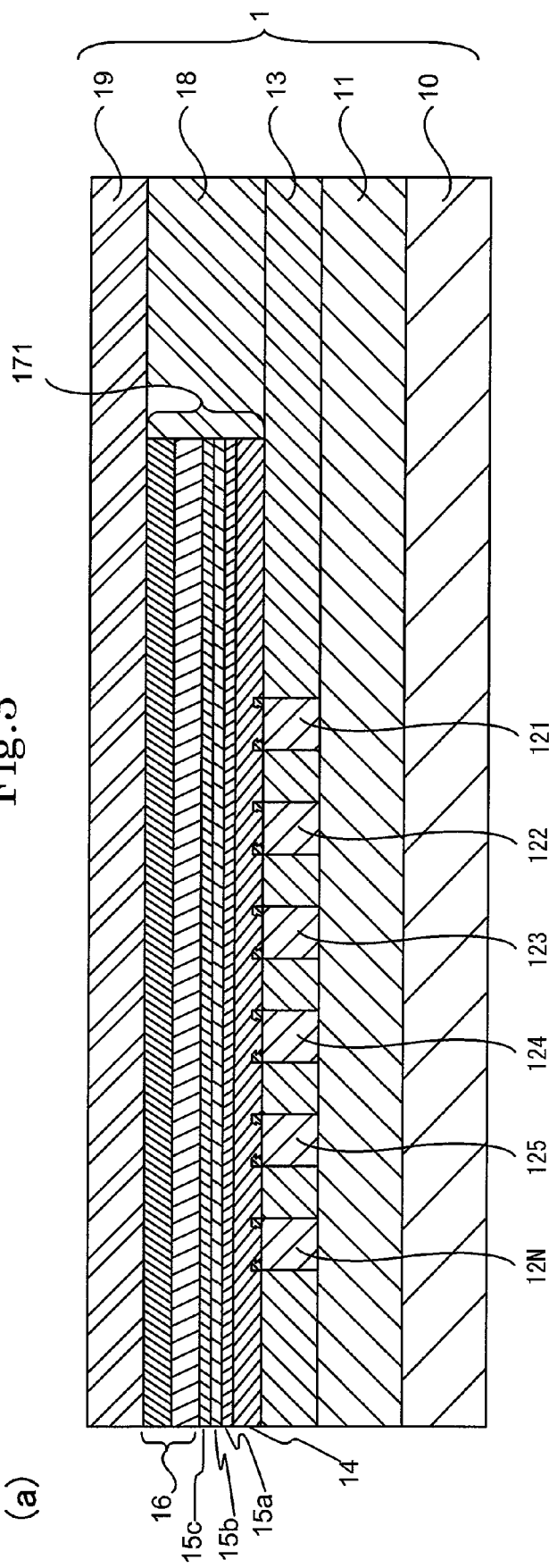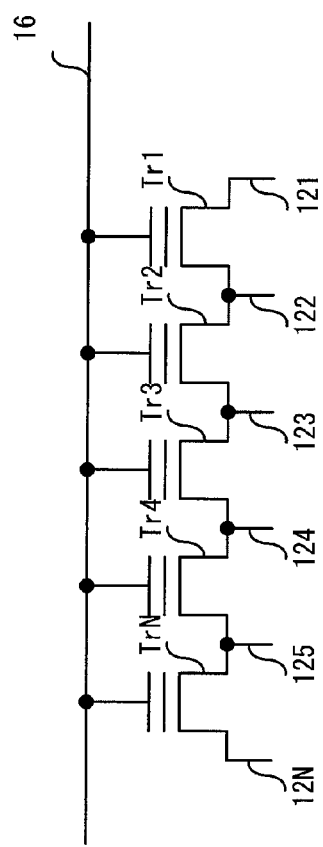

Fig.4
(a)
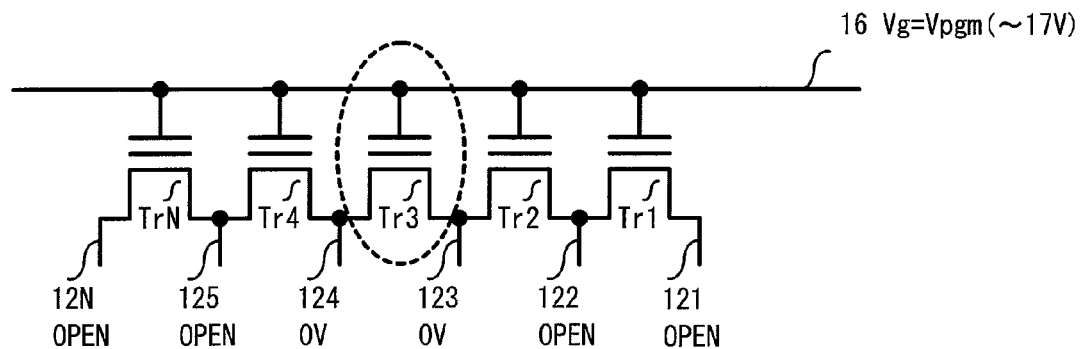
(b)
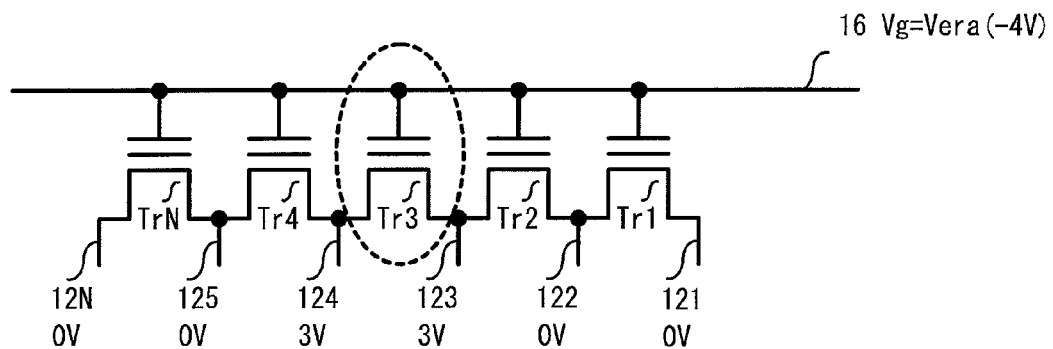
(c)
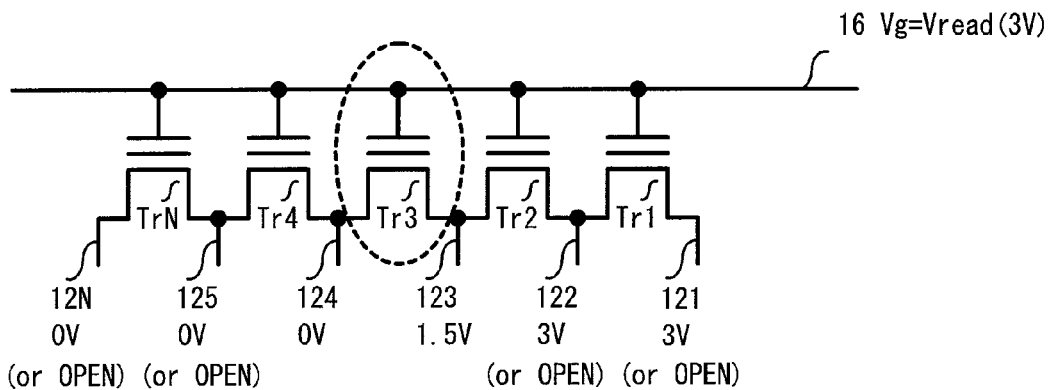

SEMICONDUCTOR DEVICE WITH CHANNEL LAYER COMPRISING DIFFERENT TYPES OF IMPURITIES

CROSS-REFERENCE TO RELATED APPLICATIONS

This application is based on and claims the benefit of priority from the prior Japanese Patent Application No. 2006-201132, filed on Jul. 24, 2006, the entire contents of which are incorporated herein by reference.

TECHNICAL FIELD

The present invention relates to a semiconductor device and a manufacturing method thereof having a transistor including semiconductor film, which is so called a thin film transistor, and in particular, relates to a semiconductor device and a manufacturing method thereof, such as a thin semiconductor device having three-dimensional thin film transistors and a three-dimensional lamination memory device, etc.

BACKGROUND OF THE INVENTION

To enhance the integration degree of a semiconductor device, experiments for laminating a thin film transistor in three dimensions have been performed. The structure of such a semiconductor device, in which a polysilicon wiring layer including a desired impurity are also used as a conductor (electrodes) of source/drain of thin film transistor, has been reported for instance in U.S. Pat. No. 6,841,813.

However, the thin film transistor with this configuration is prone to the influence of heat processes at the time of manufacturing the semiconductor device to diffuse impurities from a polysilicon used as a source/drain region into a polysilicon of the channel layer. In addition, when the thin film transistors are laminated into multi layers, the heat processes of the lower thin film transistor and that of the upper thin film transistor are different. Therefore, there is a difference in the depth of diffusion layer (a diffusion length) between the lower thin film transistor and the upper thin film transistor. Thus, there is concern that there is a difference in characteristics between the lower thin film transistor and the upper thin film transistor.

Further, for instance in Japanese Patent Laid Open No. H11-312,809A, a structure is disclosed, in which impurity diffusion shield film is formed on the substrate and further impurities diffusing from the substrate into the crystalline semiconductor layer are shielded by forming an interface state trace film formed on the impurity diffusion shield film, and in which occurrence of the interface state at a grain boundary between the crystal semiconductor layer and the interface state trace film is inhibited.

However, the configuration in which the heat process according to thin film transistors of the lower and the upper layer is different has not been sufficiently considered. Thus, the problem, in which characteristics are different between the thin film transistors that configure a semiconductor device, has not been solved.

SUMMARY OF THE INVENTION

According to one embodiment of the present invention, a semiconductor device including:

a first semiconductor region and second semiconductor region including impurities formed on an insulating layer formed on a semiconductor substrate;

an insulator formed between the first semiconductor region and the second semiconductor region;

a first impurity diffusion control film formed on the first semiconductor region and a second impurity diffusion control film formed on the second semiconductor region;

a channel layer formed on the first impurity diffusion control film and second impurity diffusion film to cross at right angles with a direction where the first semiconductor region and the second semiconductor region are extended;

a gate insulating film formed on the channel layer; and a gate electrode formed on the gate insulating layer.

According to one embodiment of the present invention, a semiconductor device including:

a plurality of transistors, the plurality of transistors being stacked, each of the plurality of transistors including:

a first semiconductor region and a second semiconductor region including impurities formed on an insulating layer formed on a semiconductor substrate;

an insulator formed between the first semiconductor region and second semiconductor region;

a first impurity diffusion control film formed on the first semiconductor region and a second impurity diffusion control film formed on the second semiconductor region, a channel layer formed on the first impurity diffusion control film and second impurity diffusion film to cross at right angles with a direction where the first semiconductor region and the second semiconductor region are extended;

a gate insulating film formed on the channel layer; and a gate electrode formed on the gate insulating film, wherein the first impurity diffusion control film and the second impurity diffusion control film are punctured, and the first semiconductor region and the channel layer and the second semiconductor region and the channel layer are electrically connected.

According to one embodiment of the present invention, a method for manufacturing a semiconductor device including:

(a) forming a first semiconductor region and a second semiconductor region in parallel to each other;

(b) forming an insulator between the first semiconductor region and the second semiconductor region;

(c) forming a first impurity diffusion control film on the first semiconductor region and second impurity diffusion control film on the second semiconductor region;

(d) forming a channel layer to cross at right angles with the first semiconductor region and the second semiconductor region;

(e) forming a gate insulating film on the channel layer;

(f) forming a gate electrode on the gate insulating film; and (g) breaking down the first impurity diffusion control film and the second impurity diffusion control film.

BRIEF DESCRIPTION OF THE DRAWINGS

FIG. 3a is a schematic sectional view showing an example of thin film transistors which configure a memory cell array of the non-volatile semiconductor memory device.

FIG. 3b is an equivalent circuit diagram of thin film transistors which configure a memory cell array of the non-volatile semiconductor memory device.

FIG. 4a is a diagram showing an example of the voltage of operation at the time of data programming of thin film transistors.

FIG. 4b is a diagram showing an example of the voltage of operation at the time of data erasing of the thin film transistors.

FIG. 4c is a diagram showing an example of the voltage of operation at the time of data reading out of the thin film transistors.

DETAILED DESCRIPTION OF THE INVENTION

Referring to accompanying figures, desirable embodiments of the present invention are explained in detail in the following description. However, the present invention can be implemented in many different aspects and should not be limited to an interpretation of the described contents of the embodiments shown below.

Embodiment 1

A semiconductor device of the Embodiment 1 according to the present invention is an example, in which the thin film transistor is made into a MONOS (Metal-Oxide-Nitride-Oxide Semiconductor) structure and is further utilized as a memory cell of a non-volatile semiconductor memory device.

Figure 1:
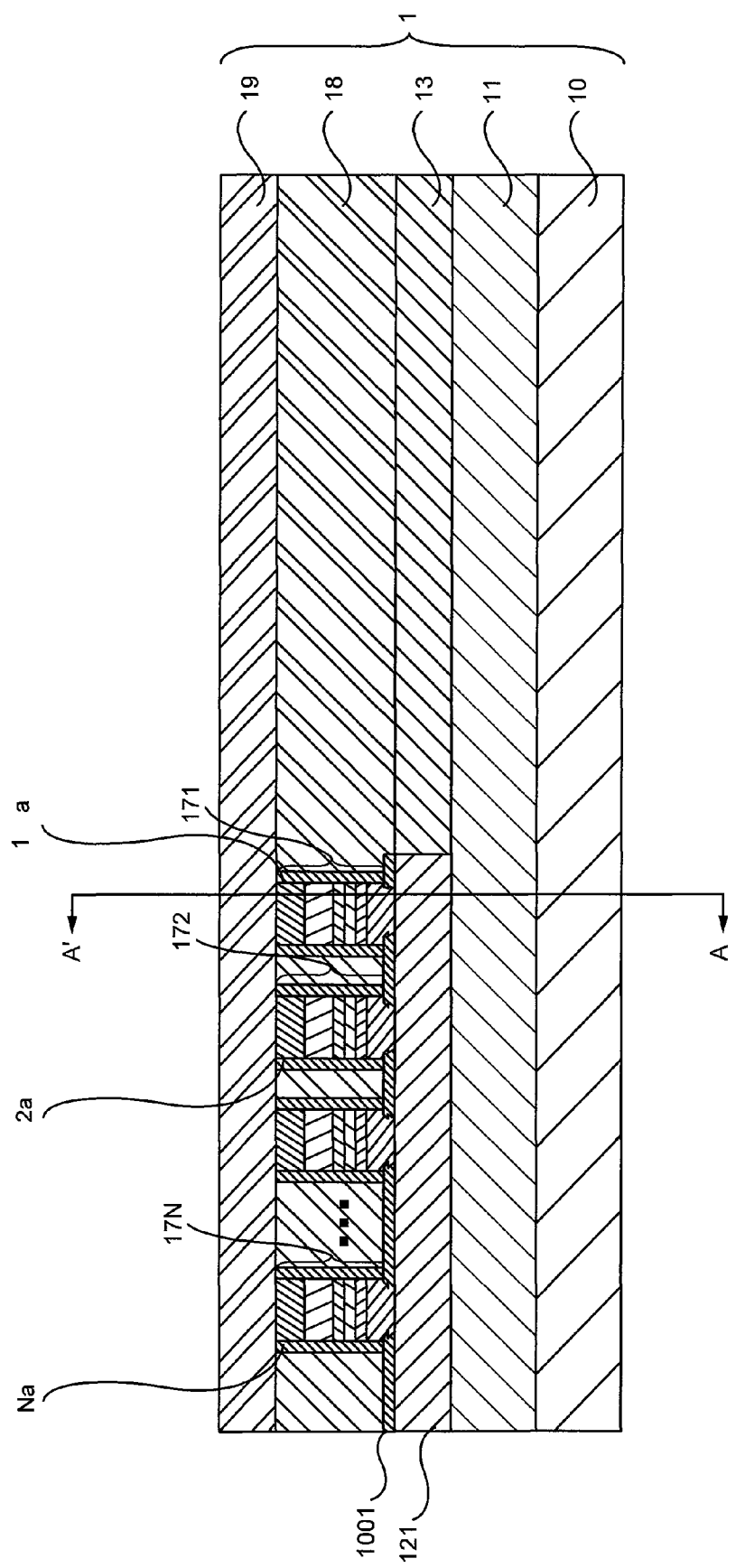
FIG. 1 is a schematic sectional view showing an example of semiconductor device of the Embodiment 1 according to the present invention.
Figure 2:
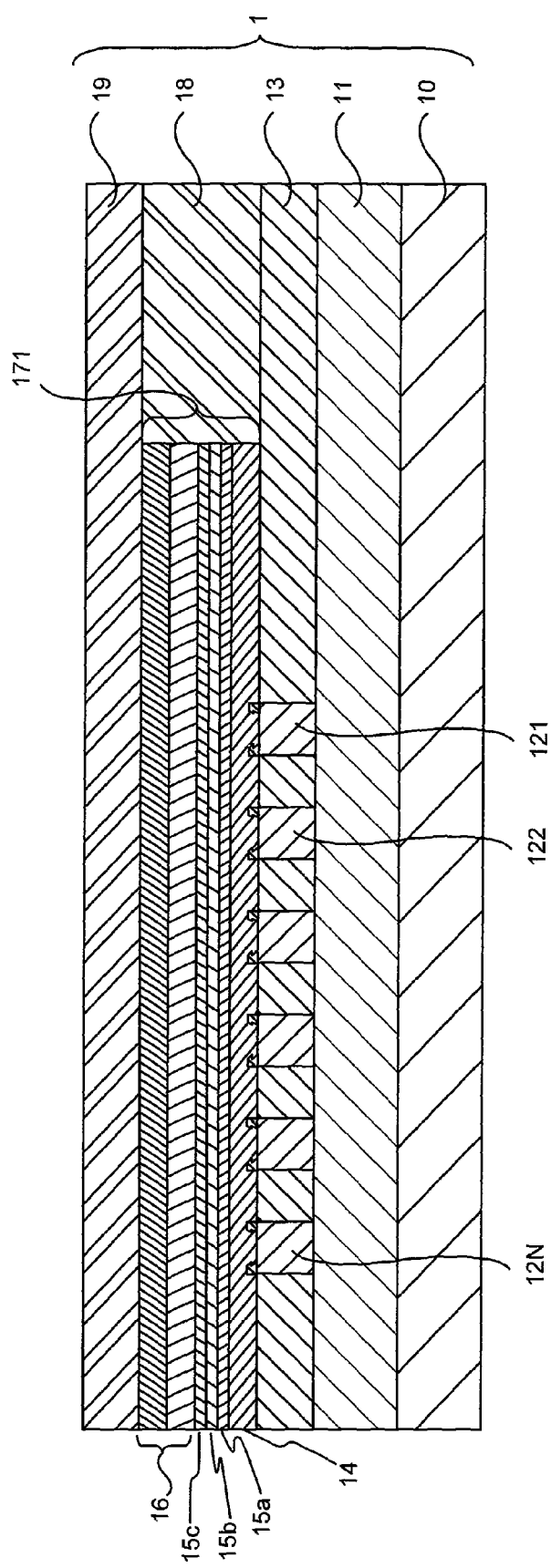
FIG. 2 is a schematic sectional view of an A-A' line shown in FIG. 1.

FIG. 1 and FIG. 2 are schematic sectional views showing a thin film transistor which configures a memory cell array of the non-volatile semiconductor memory device. FIG. 2 is a schematic sectional view when the section of the thin film transistor 1 shown in FIG. 1 is seen from the channel/gate layer 171 to 17N side direction.

The MONOS structure is a lamination structure having three layers of a first insulating layer 15a, an electric charge accumulating layer 15b and a second insulating layer 15c between a semiconductor (a channel layer) 14 and gate electrodes 16. As a material of the first insulating layer 15a, an oxide film (Oxide) is used; as a material of the electric charge accumulating layer 15b, a nitride film (Nitride) is used; and as a material of the second insulating layer 15c, an oxide film (Oxide) is used. Thus, the three-layer structure is called an ONO film. In addition, the electric charge accumulating layer 15b may be a floating gate using a polysilicon as material.

The electric charge accumulating layer (nitride film) 15b at the center of the ONO film is an insulating film. However, electric charges may be captured and accumulated because a large amount of traps exist in the electric charge accumulating layer. The ONO film is utilized as a memory cell of a non-volatile semiconductor memory device by accumulating electric charges into the traps and discharging the accumulated electric charges.

In addition, a semiconductor device of Embodiment 1 according to the present invention provides first semiconductor regions as source or drain regions and second semiconductor regions as drain or source regions 121 to 12N on the substrate. It further provides first impurity diffusion control films and second impurity diffusion control films 1001 to 100N. The first impurity diffusion control films are formed between the first semiconductor regions and a channel layer 14, and the second impurity diffusion control films are formed between the second semiconductor region and the channel layer 14. Hereafter, the first semiconductor region and the second semiconductor region are not distinguished and are called the source/drain region. Further, the first impurity diffusion control film and the second impurity diffusion control film are also not distinguished and are called the impurity diffusion control film. The semiconductor device has a structure which is capable of limiting or controlling the diffusion of impurity from the source/drain regions 121 to 12N to the channel layer 14. The impurity diffusion control films 1001 to 100N are insulating films. Then, to operate the thin film transistor with the MONOS structure as a memory cell, it is required that a dielectric breakdown process of the impurity diffusion control films 1001 to 100N be performed, and a pn junction be formed between each of the source/drain regions 121 to 12N and the channel layer 14.

A method for dielectric breakdown of the impurity diffusion control films 1001 to 100N is explained in detail in Embodiment 2 described below; however, at least one of the source/drain regions is selected and the selected region is adjusted to 0 V. Approximately 5 to 20 voltages are applied to the gate electrode and the source/drain regions except the selected source/drain region. Thereby dielectric breakdown of the impurity diffusion control film of the upper part of the selected source/drain region is performed. By repeating this process, dielectric breakdown is performed on all of the impurity diffusion control films.

Thus, the impurity diffusion control films 1001 to 100N are provided for a process of adding high heat, and thereafter dielectric breakdown is performed on the impurity diffusion control films 1001 to 100N at the stage of process in which high heat is not added, hereby, unevenness of the impurity diffusion density of the channel layer may be reduced, and unevenness of characteristics (threshold) of the thin film transistors may also be reduced. Thus, a functionally stable semiconductor device may be provided.

Hereinafter, a structure of the thin film transistors composing the semiconductor device of Embodiment 1 according to the present invention as shown in FIG. 1 and FIG. 2 is explained in detail An interlayer film 11 has a configuration in which an insulator is accumulated on a control circuit, a row decoder and the other peripheral circuits which are formed at a predetermined position on a silicon substrate 10 (not illustrated in the figures), and the interlayer film is flattened. The interlayer film 11 is formed by forming a SiO$_2$ film of film thickness approximately 200 to 500 nm.

The wiring of source/drain region (hereinafter called "an S/D region") 121, 122, ..., 12N are composed of a semiconductor including impurities, and preferably to be formed with film thickness of approximately 50 to 200 nm. In addition, in the present invention, the impurities are ion producing carriers (positive holes or electrons) within a semiconductor. As a material of the source/drain, amorphous silicon, nano crystallite silicon, polycrystalline silicon and such are preferable. As an impurity, germanium, nickel, phosphorus, boron, arsenic and such are may be proposed. The density of impurity depends on the kind of impurities, to put it concretely, it is preferable that the density of impurity is within a range of approximately 10 E+19 to 10 E+21 ions/cm$^3$.

Also, the S/D regions between 121, 122, 12N, are filled with an insulator and the upper surfaces of the wiring layer are leveled to a height so they are exposed. In addition, the insulator that is similar to the interlayer film 11 may be used for the insulator.

The impurity diffusion control films 1001 to 100N are formed between each of the S/D regions 121 to 12N and the channel layer 14. As a material of the impurity diffusion control films 1001 to 100N, silicon dioxide, silicon nitride, tantalum oxide, aluminum oxide and such are proposed. In addition, as a size of the impurity diffusion control films 1001 to 100N, the width is equalized to that of the S/D region 121, 122, ..., 12N, and the film thickness is formed within a range of approximately 0.5 to 10.0 nm. When the film thickness of the impurity diffusion control films 1001 to 100N are formed to approximately 1.0 to 10.0 nm, the impurities included in the source/drain are not diffused but covered on the channel layer 14 without regard for its heat history. Therefore, the characteristics of the thin film transistors of each layer do not deteriorate and thus, a semiconductor, which is miniaturized and dense, may be manufactured. The semiconductor device is functionally stable. Further, when the film thicknesses of the impurity diffusion control films 1001 to 100N are formed at approximately 0.5 to 1.0 nm, the diffusion length in the thin film transistors of each of the layers in which heat histories are different, may be arranged within a desired range.

As shown in FIG. 1 and FIG. 2, the channel layer 14, a three-layer lamination structure of a first insulating layer 15a, an electric charge accumulating layer 15b and a second insulating film 15c and gate electrodes 16 are formed to cross at a right angle from an upper side of source/drain regions 121 to 12N. Further, as shown in FIG. 1, the channel gate layers 171 to 17N are formed to be parallel to each other maintaining equivalent spaces, and all the channel/gate layers are formed to cross at a right angle from an upper side for the S/D regions 121 to 12N.

The size of the channel layer 14 is not particularly limited, however, it is preferable that the film thickness be not more than approximately 200 nm. As a material for configuring the channel layer 14, amorphous silicon, nano crystallite silicon, polycrystalline silicon and such are preferred. As impurities, germanium, nickel, phosphorus, boron, arsenic and such may be contained. In addition, it is preferable that the density of impurity density of the channel layer 14 (a doping quantity of the impurity ions) be relatively lower than the density impurity contained in the S/D regions 121 to 12N.

On the channel layer 14, as described above, the first insulating layer 15a, the electric charge accumulating layer 15b and the second insulating layer 15c are formed. As a material of the first insulating layer 15a, an oxide film (Oxide) is used; as a material of the electric charge accumulating layer 15b, a nitride film (Nitride) is used; and as a material of the second insulating layer 15c, an oxide film (Oxide) is used. These insulating layers are formed by a sputtering method, the CVD method, a remote plasma CVD method, and the LPCVD method, etc. The three-layer lamination structure of the first insulating layer 15a, the electric charge accumulating layer 15b and the second insulating layer 15c, is formed to a film thickness of approximately 2 to 20 nm.

The gate electrode 16 is formed on the channel layer 14 via the three-layer lamination structure of the first insulating layer 15a, the electric charge accumulating layer 15b, and the second insulating layer 15c. The size is not particularly limited. In addition, the gate electrode 16 may be formed by a silicidation of the polysilicon surface with the film thickness within a range of approximately 50 to 200 nm, with metal appropriately selected from chrome, titanium, copper, aluminum, molybdenum, tungsten, palladium, nickel, gold, platinum, organic semiconductor and such.

In addition, as shown in FIG. 1, at the side wall of the channel/gate layers 171 to 17N, overcoat 171a to 17Na may be formed. As a material for the overcoat, insulator such as nitride dioxide, silicon nitride, tantalum oxide, aluminum oxide, etc. are preferably used. By selecting appropriately the insulator and performing methods such as a sputtering method, the CVD method, a remote plasma CVD and the LPCVD, the overcoat is formed with a thickness of approximately 10 to 30 nm. Further, the overcoats 171a to 17Na with thickness of approximately 100 to 400 nm from the side surface of the channel/gate layers 171 to 17N are formed. Thus, the thin film transistor 1 is formed. Further, the thin film transistor 1 is formed by completely filling the overcoats 171a to 17Na from the upper side surface of the channel/gate layers 171 to 17N within the interlayer films 18 and 19, with a film thickness of approximately 100 to 400 nm. In addition, an insulator which is similar to the interlayer film 11 may be used for the interlayer films 18 and 19.

The source/drain region 12, the channel layer 14, and the three-layer lamination structure of the first insulating layer 15a, the electric charge accumulating layer 15b, and the second insulating layer 15c and gate electrode 16 are formed to a predetermined film thickness by a formation process of plasma Chemical Vapor Deposition (CVD) method, low-pressure CVD method and such. In addition, as a method for injecting impurities into the source/drain region 12 and the channel layer 14, an ion injection method and an ion doping method are proposed. Also, it is preferred that the impurity diffusion control film be formed as an insulating film by the sputtering method, the CVD method, the low-pressure CVD method, the plasma CVD method, and the remote plasma CVD method and such.

FIG. 3(a) is a schematic sectional view showing a thin film transistor configuring a memory cell array of a non-volatile semiconductor memory device. FIG. 3(b) is an equivalent circuit diagram corresponding to FIG. 3(a).

The source/drain regions 121 to 12N shown in FIG. 3 correspond to a source/drain terminal 121 to 12N of a thin film transistor Tr1 to TrN shown in FIG. 3(b). Further, the gate electrode 16 shown in FIG. 3(a) corresponds to a gate terminal 16 shown in FIG. 3(b). Each of the thin film transistors Tr1 to TrN functions as a memory cell.

The non-volatile semiconductor memory device shown in FIG. 3(a) has a three-layer lamination structure of the first insulating layer 15a, the electric charge accumulating layer 15b, and the second insulating layer 15c. This electric charge accumulating layer 15b is a non-volatile semiconductor device that accumulates electric charges as a floating gate.

Next, the programming, erasing and reading out of memory cells are explained respectively, using FIG. 3(a) and FIG. 4(a) to (c). FIG. 4(a) is a diagram showing a voltage of operation at the time of programming data into the thin film transistor Tr3 among the thin film transistors Tr1 to TrN. The gate electrode 16 of the thin film transistors Tr1 to TrN is common, and the gate electrode 16 applies a high voltage to a level of approximately 17 V. It is assumed that the S/D regions (the source/drain electrodes) 123 and 124 of the thin film transistor Tr3 that is the object of programming data is set at 0 V; and the other S/D regions (source/drain electrodes) 121, 122, 125, 12N set at open (OPEN). In this way, a tunnel current is passed in a space between the channel layer 14 which is between the drain /source 123 and 124 of the thin film transistor Tr3, and the gate electrode 16. By a tunneling effect, electrons are passed through the first insulating layer 15a and are injected into the electric charge accumulating layer 15b. By injecting the electrons into the electric charge accumulating layer 15b, programming of data is performed. Further in FIG. 4(a), while only the Tr3 was the object of programming, by setting the S/D region (source/drain electrode) of the thin film transistor considered to become an object of programming to be 0 V, data may be programmed into the thin film transistor considered to be an object of programming FIG. 4(b) is a diagram showing a voltage of operation at the time of erasing data of the thin film transistor Tr3, among the thin film transistors Tr1 to TrN. The gate electrode 16 of the thin film transistors Tr1 to TrN is common, and the gate electrode 16 applies a negative voltage of approximately −4 V. The S/D regions (source/drain electrodes) 123 and 124 of thin transistor Tr3 that is an object of erasing data are applied with a voltage of approximately 3 V. The other S/D regions (source/drain electrodes) 121, 122, 125, 12N are set at 0 V. In this way, a tunnel current, opposite to the above described programming operation, is passed in the space between the channel layer 14 between the drain/source 123 and 124 of the thin film transistor Tr3 and the gate electrode 16. Electrons injected in the electric charge accumulating layer 15b pass through the first insulating layer 15a and shift to the channel layer 14. Erasing of data is performed because electrons injected in the electric charge accumulating layer 15b pass through the first insulating layer 15a and shift to the channel layer 14. In addition, the object of data erasing was only the Tr3 in FIG. 4(b), however, data may be erased from the thin film transistor considered to be an object of erasing by setting the S/D region (source/drain electrode) of the thin film transistor considered to be an object of erasing at approximately 3 V.

FIG. 4(c) is a diagram showing a voltage of operation at the time of data read out of the thin transistor Tr3 among the thin film transistors Tr1 to TrN. The gate electrode 16 of the thin film transistors Tr1 to TrN is common, and the gate electrode 16 applies a voltage of approximately 3 V. A source side of the S/D region (source/drain electrode) of the thin film transistor Tr3 that is an object of read out data is set at 0 V. A drain side 123 of the S/D region of the thin film transistor Tr3 is applied with a voltage of approximately 1.5 V. The other source/drain regions (source/drain electrodes) 125 and 12N are set at open (OPEN), and 121 and 122 are set at approximately 3 V or open (OPEN). In this way, very little current flows between the drain and source of the Tr3 when electrons are accumulated in the electric charge accumulating layer 15b of the Tr3. On the other hand, current flows between the drain and the source of the Tr3 when electrons are not accumulated in the electric charge accumulating layer 15b. In other words, the electrons injected to the electric charge accumulating layer 15b controls conduction of the channel region of the thin film transistor. As a consequence, contents of the binary data which are kept in the electric charge accumulating layer 15b are detected by detecting conduction of the thin film transistor.

The thin film transistor 1 configured as above can be used as a memory cell of the MONOS structure, and functions as a non-volatile semiconductor memory device. However, the present invention should not be interpreted limited to this and the range of applications of the semiconductor device of the Embodiment 1 can covers many things such as liquid crystal display devices, a memory device, etc.

In the following, a manufacturing method of the semiconductor device of Embodiment 1 of the present invention is explained using FIG. 5 to FIG. 10 showing each process of the section of the device.

(1) Formation Process of the S/D Regions 121 to 12N

Figure 5:
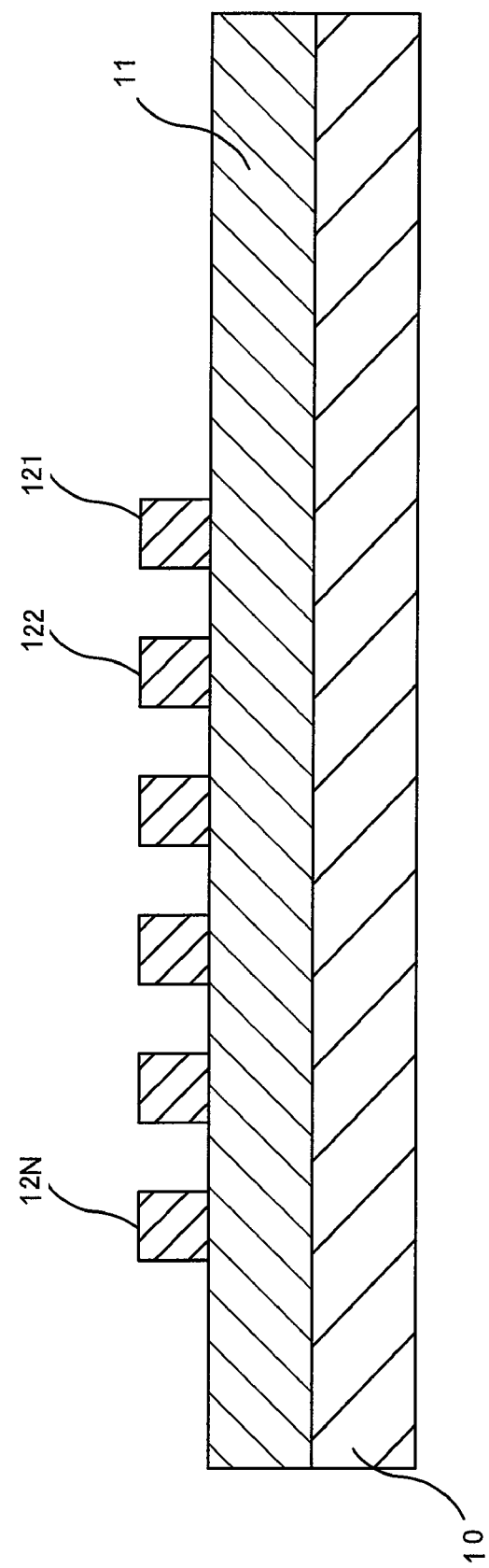
FIG. 5 is a schematic sectional view showing an example of the formation process of source/drain regions 121 to 12N of a semiconductor device of Embodiment 1 according to the present invention.

At first, as shown in FIG. 5, a control circuit, a row decoder and other peripheral circuits are formed at the desired position (not illustrated in the figure) on a silicon substrate 10 using a CMOS process. Further on these circuits, the interlayer film 11 formed of an insulating film is accumulated and filled. Then, it is leveled. Next, polysilicon (or amorphous silicon) in which n-type impurities are doped is accumulated at a desired position on the interlayer film 11 by a method such as the CVD method and a low-pressure Chemical Vapor Deposition (LPCVD), etc., then the accumulated polysilicon is etched in the shape of wiring. Thereby, the N S/D regions 121 to 12N, which are the desired number, are placed in parallel maintaining equivalent intervals to each other.

Figure 6:
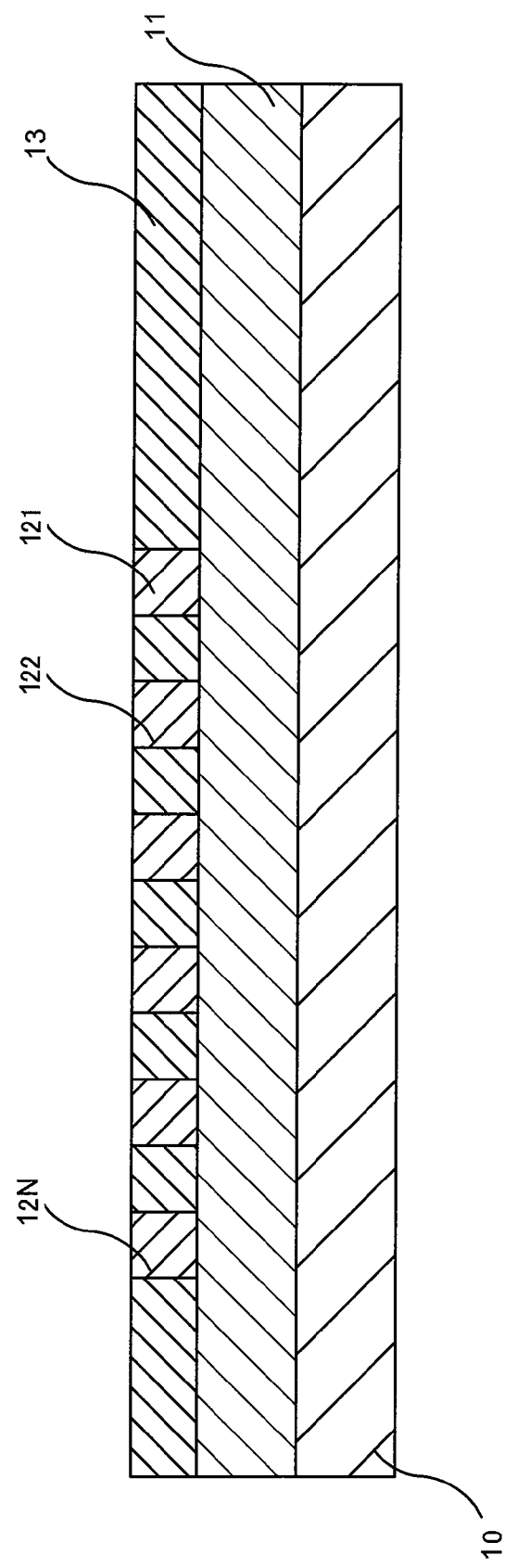
FIG. 6 is a schematic sectional view showing an example of the process, in which a wiring space of the source/drain regions shown in FIG. 5 is filled with insulator.

Next as shown in FIG. 6, the spaces among S/D regions 121 to 12N are filled with insulator by accumulating the interlayer film 13 on the interlayer film 11. At the same time of or after filling by the insulator, the S/D regions are leveled to a height so that the upper surfaces of the S/D regions are exposed.

(2) Formation Process of the Impurity Diffusion Control Film

Figure 7:
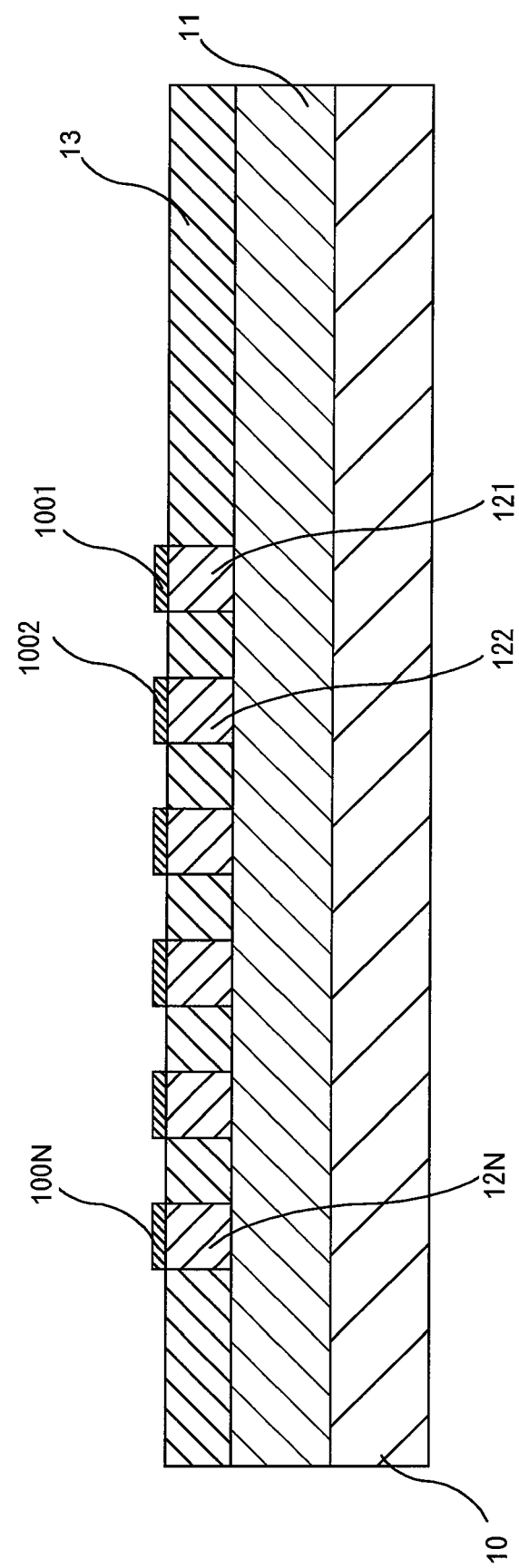
FIG. 7 is a schematic sectional view showing an example of the process, in which impurity diffusion control film is formed on an upper surface of the wiring of the source/drain regions shown in FIG. 6.

Next as shown in FIG. 7, SiO$_2$ films of approximately 2 nm in film thickness, which become impurity diffusion control films 1001 to 100N, are formed on each of the upper surface of the S/D regions 121 to 12N, by performing thermal oxidation of each of the upper surface of S/D regions.

(3) Formation Process of the Channel Layer and the Gate Electrode (Channel/Gate Layer)

Figure 8:
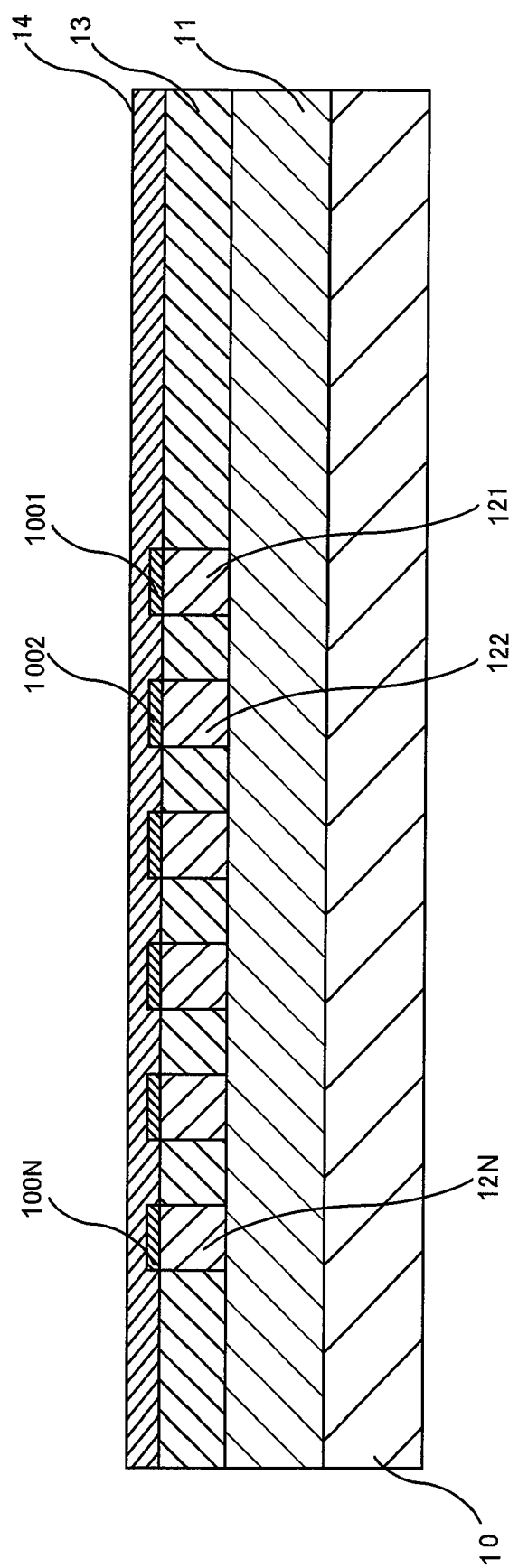
FIG. 8 is a schematic sectional view showing an example of the process forming a channel layer on the impurity diffusion control films shown in FIG. 7.

Next as shown in FIG. 8, polysilicon (or amorphous silicon), in which p-type impurity is included, is formed as a channel layer 14 of approximately 50 nm the film thickness, by a method such as the CVD method and LPCVD method, etc. At this time, between each of the S/D regions 121 to 12N and the channel layer 14 SiO$_2$ films are formed as the impurity diffusion control films. Therefore, the n-type impurity included in the S/D regions is intercepted and/or limited from diffusion into the channel layer 14 in which the p-type impurity is included by heat that is added in the subsequent manufacturing process of the semiconductor device such as heat process, etc.

Figure 9:
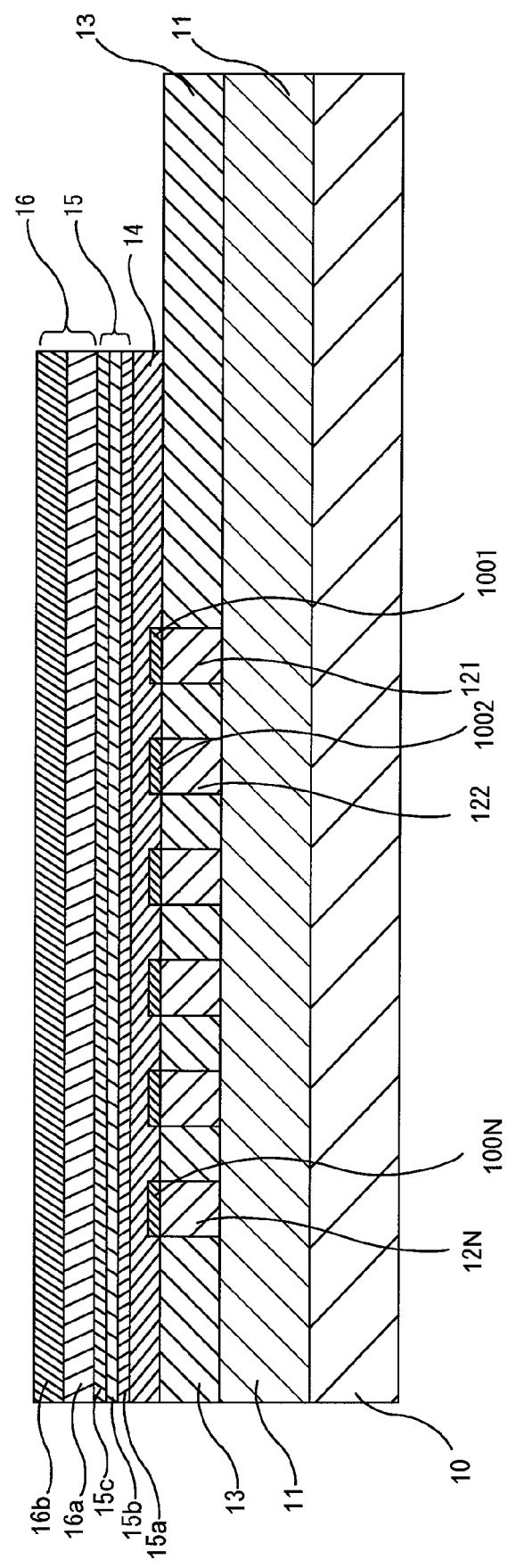
FIG. 9 is a schematic sectional view showing an example of the process, in which gate insulating films and gate electrodes are formed on the channel layer shown in FIG. 8.

Next as shown in FIG. 9, thermal oxidation is performed to the surface of the polysilicon, after the polysilicon (or amorphous silicon) including the p-type impurity is accumulated by the CVD method. Thereby a SiO$_2$ film 15a of approximately 2 nm in film thickness is formed. Further, by the method similar to the method for forming the film, a silicon nitride film 15b of approximately 5 nm in film thickness and a SiO$_2$ film 15c of approximately 8 nm in film thickness are formed.

Next, as shown in Fig. 9, a polysilicon film 16a of approximately 50 to 200 nm is formed on the three-layer lamination structure of the first insulating layer 15a, the electric charge accumulating layer 15b, the second insulating layer 15c by methods such as the CVD method and the LPCVD, etc. Further, titanium/titanium nitride film 16b is formed by titanium-silicidation of the surface of the polysilicon film 16a, thereby gate electrode 16 is formed.

Figure 10:
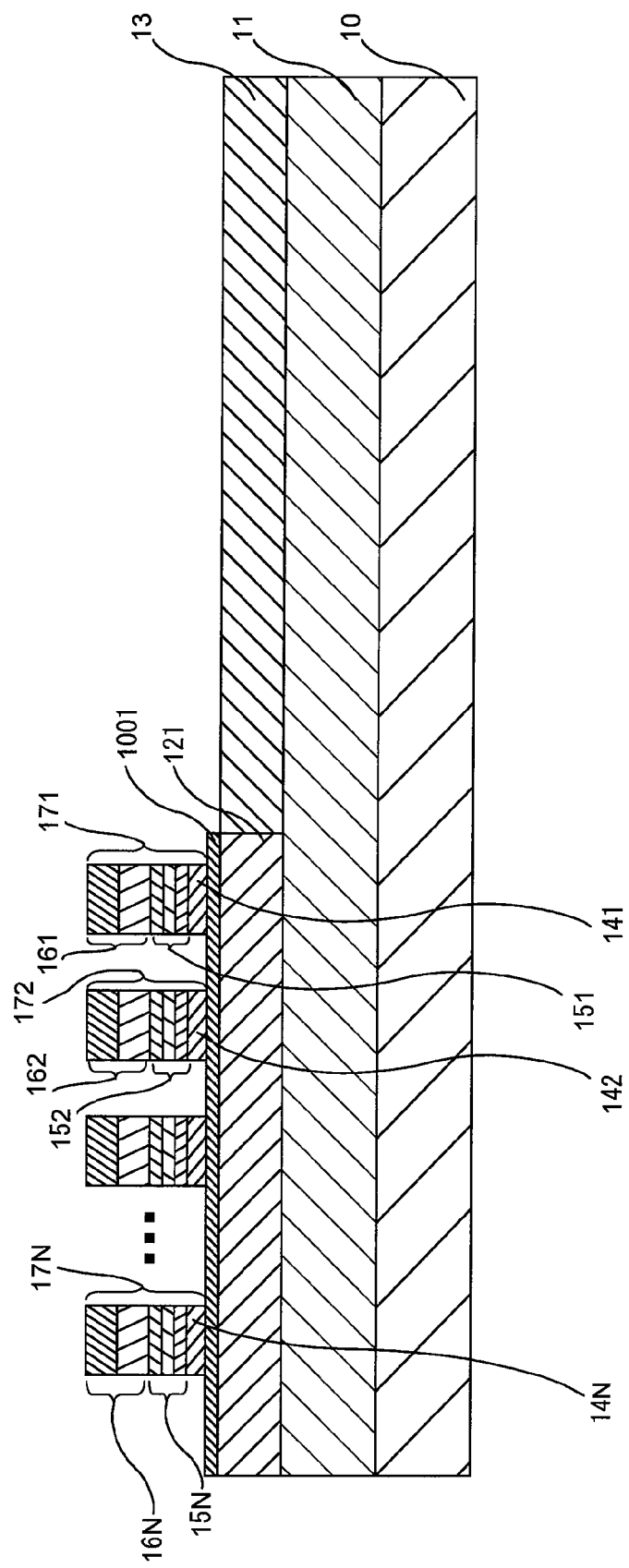
FIG. 10 is a schematic sectional view showing an example of the process, in which a channel/gate layer is formed to make the layer cross at a right angle from an upper side of the source/drain region.

Next, as shown in FIG. 10, the channel layers 141 to 14N, the gate insulating film 151 to 15N, and the gate electrodes 161 to 16N are formed so that either of the channel layers 141 to 14N, the gate insulation films 151 to 15N and the gate electrodes 161 to 16N are crossed at a right angle of the S/D region 121 by etching the channel layer 14, the gate insulating film 15 and the gate electrode 16 at one time. Thereby, the desired number of channel/gate layers 171 to 17N placed in parallel is formed to be parallel to each other maintaining an equivalent interval as shown in FIG. 10. Either channel/gate layers are formed to cross at a right angle from the upper side for the S/D region 121.

Next, as shown in FIG. 1, overcoats 171a to l71Na are formed as insulator on the side walls of the channel gate layers 171 to 17N. In this embodiment, thermal oxidation is performed to the side walls of the channel/gate layers 171 to 17N, i.e., the side walls of the channel layer 141 to 14N, the gate insulating films 151 to 15N and gate electrodes 161 to 16N, thus the overcoats 171a to 17Na are formed. Afterwards, the thin film transistor of the first layer 1 is formed by completely filling the overcoats 171a to 171Na with the interlayer films 18 and 19, to a film thickness of approximately 100 to 400 nm from the upper side surface of the channel/gate layer 171 to 17N. In addition, the interlayer films 18 and 19 may use a similar insulator as the interlayer films 11 and 13 as its material, and may form a film by a similar method as interlayer films 11 and 13.

The semiconductor device of Embodiment 1 is configured by thin transistors 1 of the first layer that are manufactured as in the above explanation.

Embodiment 2

Figure 11:
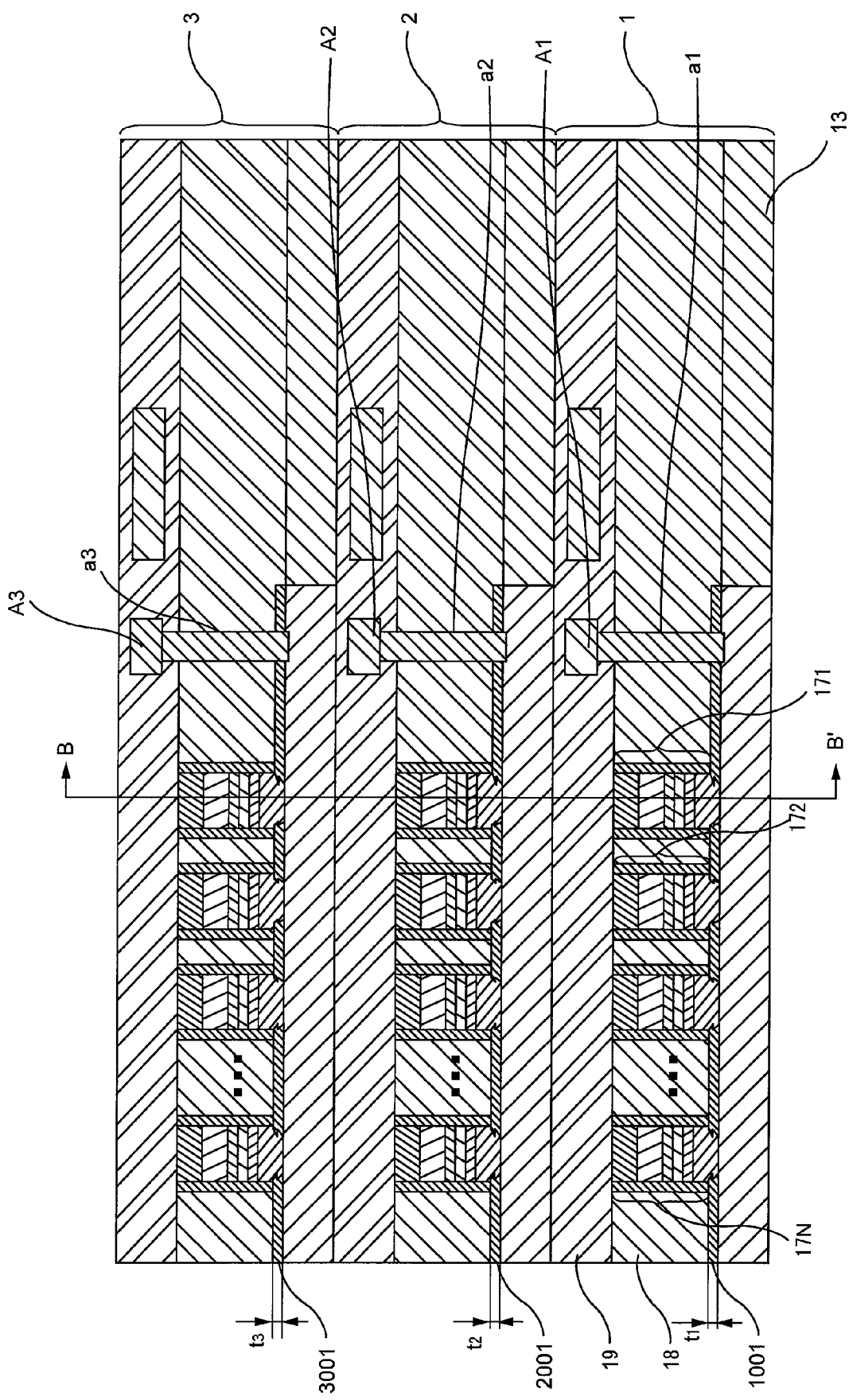
FIG. 11 is a schematic cross sectional view showing an example of the process, in which a thin film transistor laminated in a plurality of layers of the Embodiment 2 according to the present invention is formed.
Figure 12:
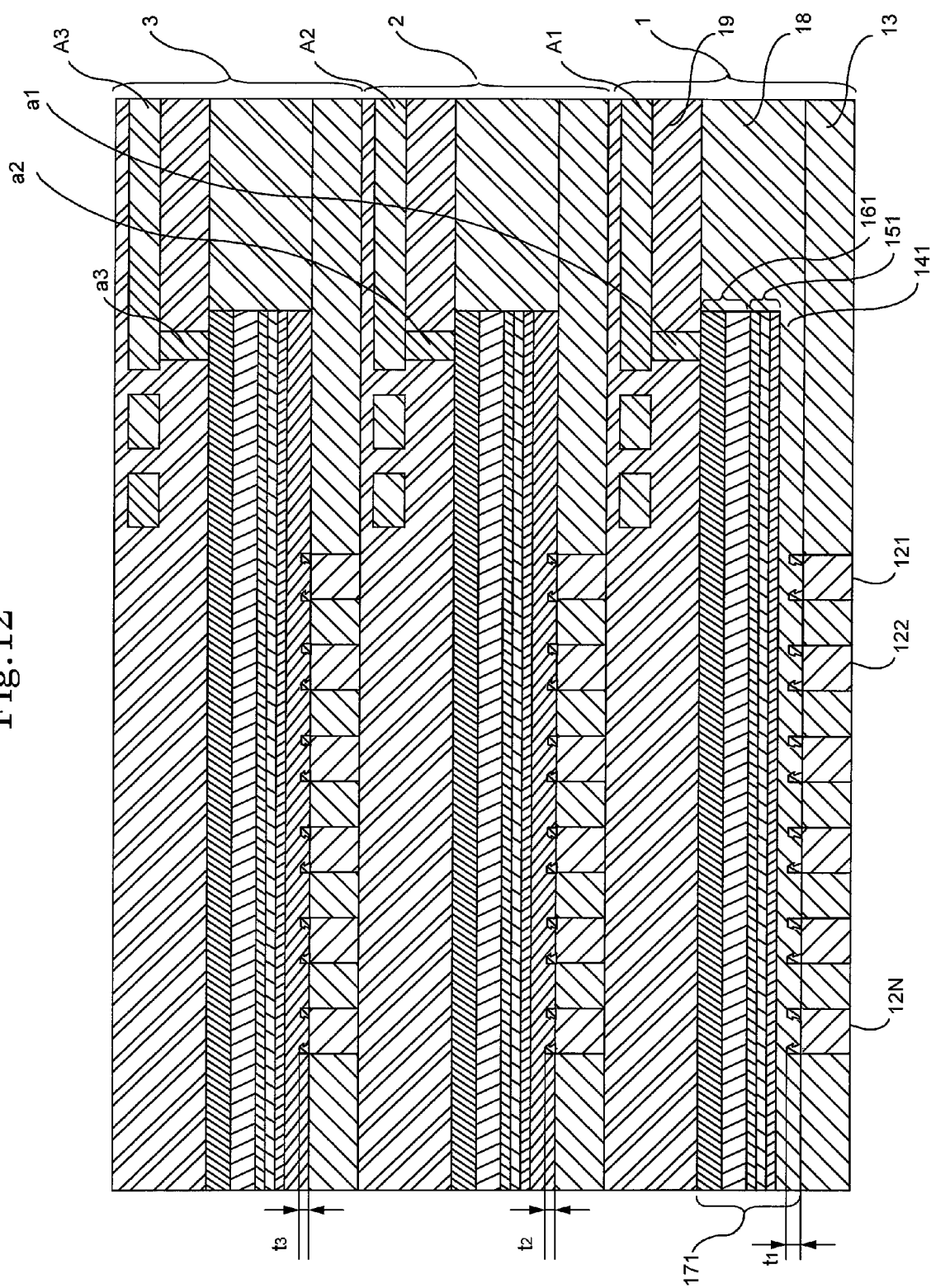
FIG. 12 is a schematic sectional view of B-B' line shown in FIG. 11.

As shown in FIG. 11 and FIG. 12, the semiconductor device of Embodiment 2 is configured, by the thin film transistors 1 which form Embodiment 1 which are laminated and densified. The semiconductor device of Embodiment 2 have first, second and third semiconductor device which are laminated. Each of the first, second and third semiconductor device is thin film transistor. The thin film transistors existing above the first layer position are formed by repeating the manufacturing process of the semiconductor device of Embodiment 1. Thin film transistors 2 of the second layer position and third thin film transistors 3 of the third layer position are formed on the thin film transistors 1 in turn. Thus, the desired number of three-dimensional lamination memory device may be formed, as shown in FIG. 11 and FIG. 12. In addition, FIG. 12 is a schematic sectional view seen in a parallel direction for the source/drain regions 121 to 12N from the channel/gate layers 171 side of the thin film transistor of Embodiment 1.

The semiconductor device of Embodiment 2 of the structure shown in FIG. 11 and FIG. 12 shows an example, in which each of the thin film transistors is set to be a MONOS structure (Metal-Oxide-Nitride-Oxide-Semiconductor) and is used as a memory cell of the non-volatile semiconductor memory device, as well as the first embodiment.

If the impurity diffusion control films exist between each of the source/drain regions and each of the channel layers of the thin film transistors 1, 2 and 3, each of the source/drain regions and each of the channel layers configuring the thin film transistors 1, 2 and 3 are in non-conductive electrical state. Therefore, the thin film transistors 1, 2 and 3 do not function as a thin film transistor. Accordingly, the dielectric breakdown of the impurity diffusion control films is performed in the last process.

With the following process, the dielectric breakdown of the impurity diffusion control films is performed. At first, in the thin transistors of each layer, at least one source/drain region is selected. Next, high voltage is applied between the selected source/drain region, and other source/drain regions and the gate electrodes. Thereby, the dielectric breakdown of the impurity diffusion control films is performed on the selected source/drain region.

Figure 13:
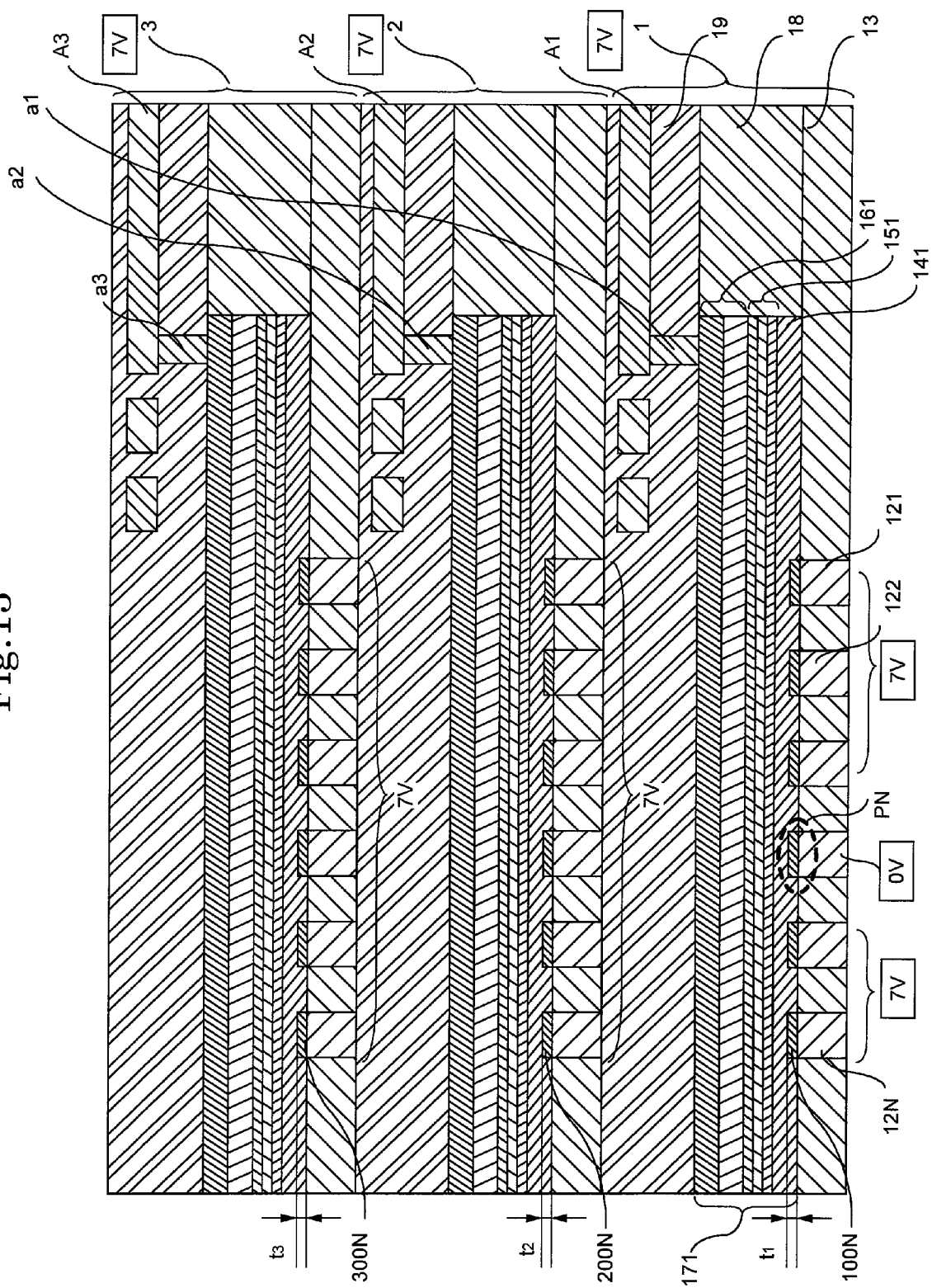
FIG. 13 is a schematic sectional view showing an example of the process, in which dielectric breakdown is performed to the impurity diffusion control films between the source/drain regions and the channel layer of the channel/gate layers.

An example is shown in FIG. 13. For instance, 7 V is applied to the gate electrodes of thin film transistors of each of the layers from electrode wirings A1 to A3 via electrode wirings a1 to a3 shown in FIG. 13. The potential of the source/drain region forming the impurity diffusion control film which is an object for dielectric breakdown thereon, is adjusted to 0V. Potentials of the rest of the source/drain regions are biased to become approximately 7 V. In addition, approximately 7 V is applied to the source/drain regions from the electrode wirings A1 to A3 via the electrode wirings a1 to a3. Thereby, dielectric breakdown of the impurity diffusion control film on the upper part of source/drain region adjusted to 0 V is performed.

By selecting the source/drain regions in turn and performing the above-described dielectric breakdown process, the impurity diffusion control films which are between the source/drain regions of the thin film transistors and channel layers in the all layers, are dielelectrically broken down and pn junctions are formed. By the dielectric breakdown process, the semiconductor device of Embodiment 2 having the configuration shown in FIG. 11 and FIG. 12 may perform a thin film transistor operation and a memory device operation normally.

Embodiment 3

Unlike Embodiment 1, Embodiment 3 is an embodiment forming the impurity diffusion control film by depositing a $SiO_2$ film on the S/D regions 121 to 12N and the interlayer film 13. In other words, in Embodiment 1, the impurity diffusion control films of the $SiO_2$ with the film thickness of approximately 2 nm are respectively formed by performing thermal oxidation of each of the upper surfaces of the S/D regions 121 to 12N. However, Embodiment 3 proposes a method for forming the impurity diffusion control film of $SiO_2$ film by depositing the $SiO_2$ film.

Figure 14:
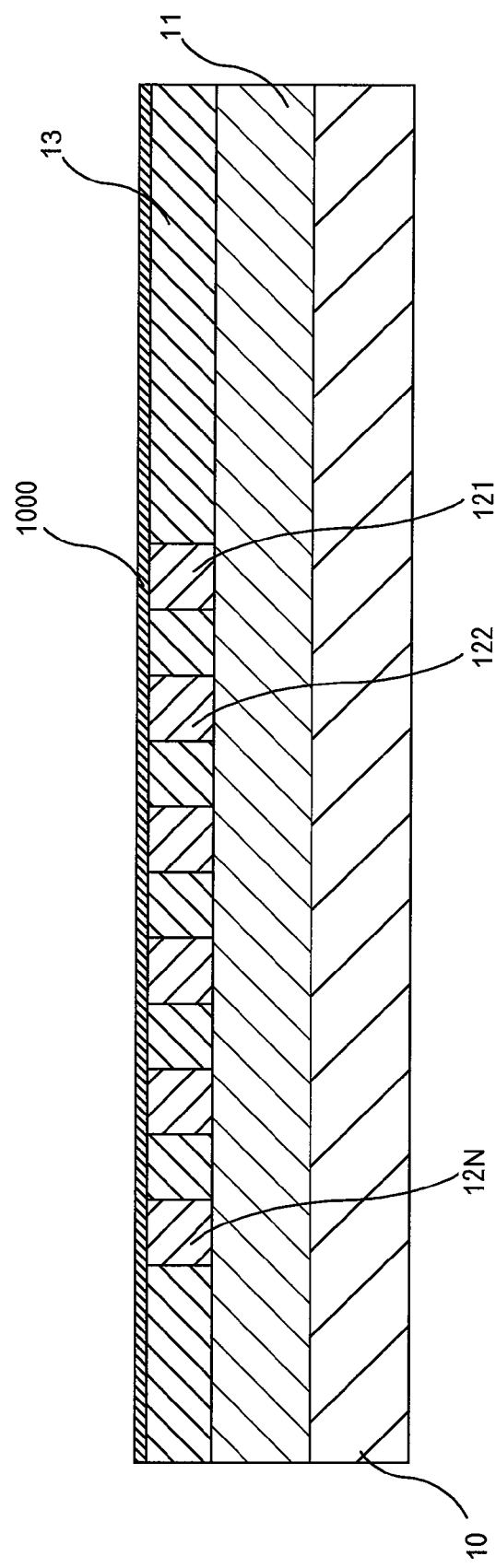
FIG. 14 is a schematic sectional view showing an example of the process, in which an impurity diffusion control film is formed on the upper surface of the source/drain regions and the whole surface of interlayer film of Embodiment 3 according to the present invention.

As shown in FIG. 14, the S/D regions 121 to 12N are formed on the interlayer film 11; and the S/D regions 121 to 12N are filled with insulator by accumulating the interlayer film 13 on the interlayer film 11. After these processes, an impurity diffusion control film 1000 of the $SiO_2$ film is accumulated using the CVD. Therefore, the impurity diffusion control film 1000 is formed not only on each of the upper surface of the S/D regions 121 to 12N but also on the whole upper surface of the S/D regions 121 to 12N and the interlayer films 13.

Figure 15:
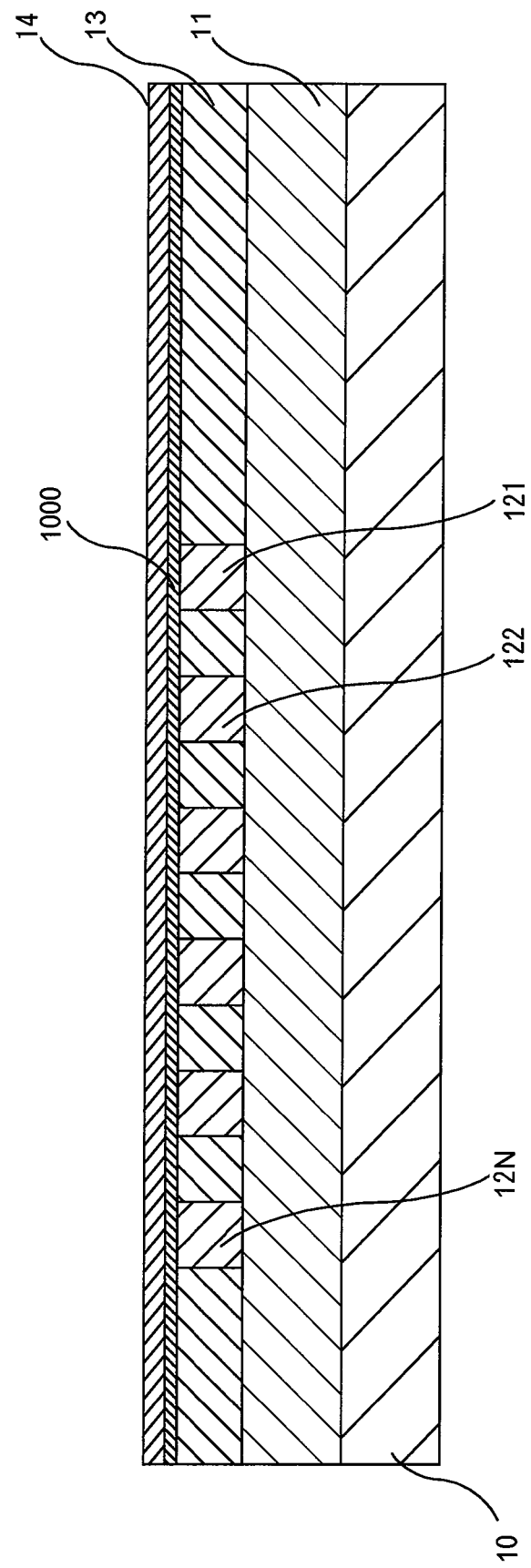
FIG. 15 is a schematic sectional view showing an example of the process, in which a channel layer is formed on the impurity diffusion control film shown in FIG. 14.
Figure 16:
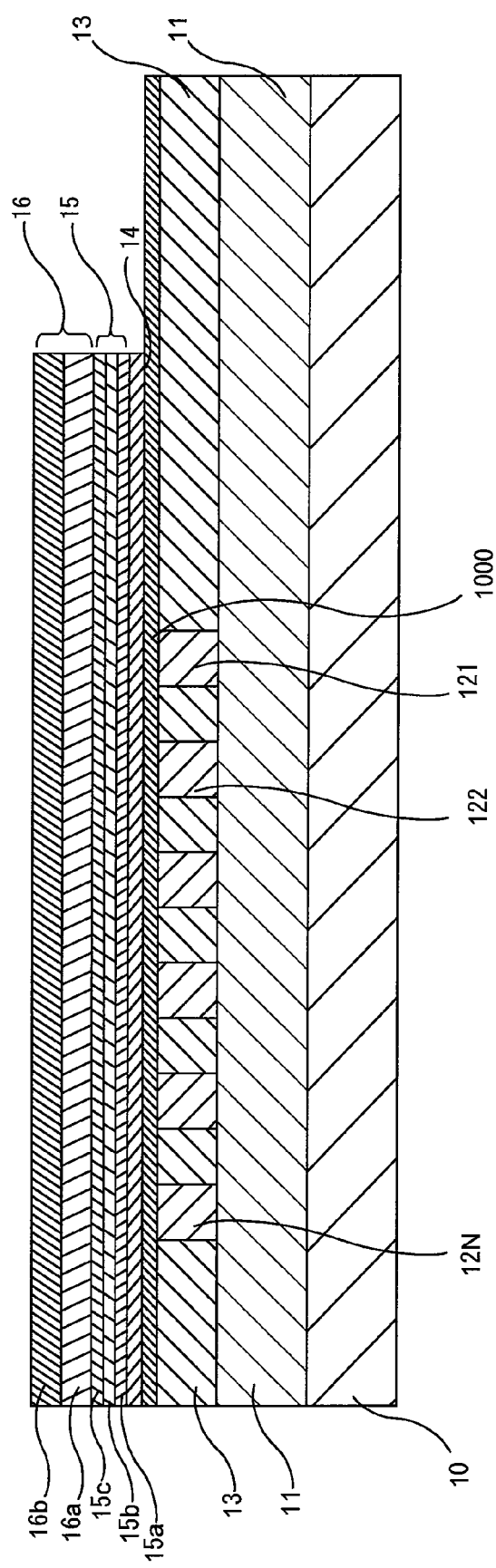
FIG. 16 is a schematic sectional view showing an example of the process, in which gate insulation films and gate electrodes are formed on the channel gate layer shown in FIG. 15.
Figure 17:
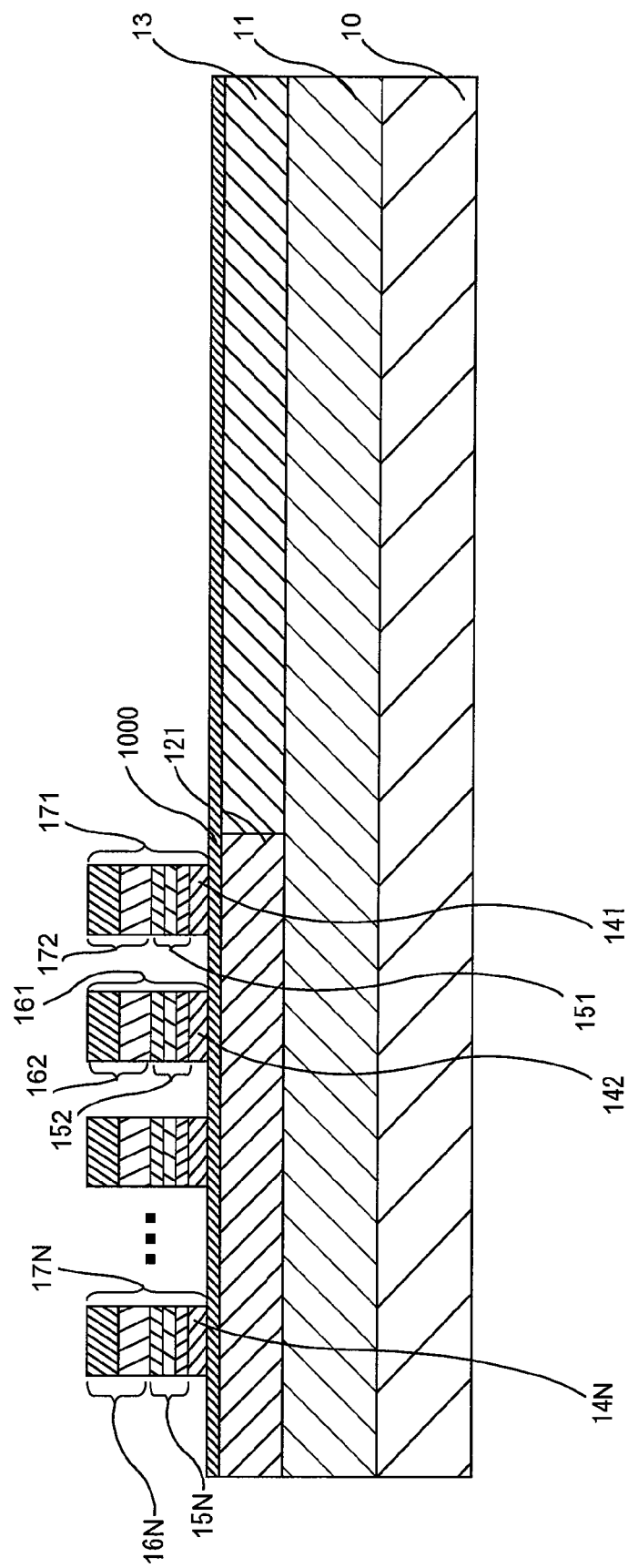
FIG. 17 is a schematic sectional view showing an example of the process, in which a channel gate layer is formed to make the layer cross at a right angle from an upper side for the source/drain region.

The processes after accumulating the impurity diffusion control film 1000 are the same as Embodiment 1, as shown in FIG. 15 and FIG. 16.

Embodiment 4

Figure 18:
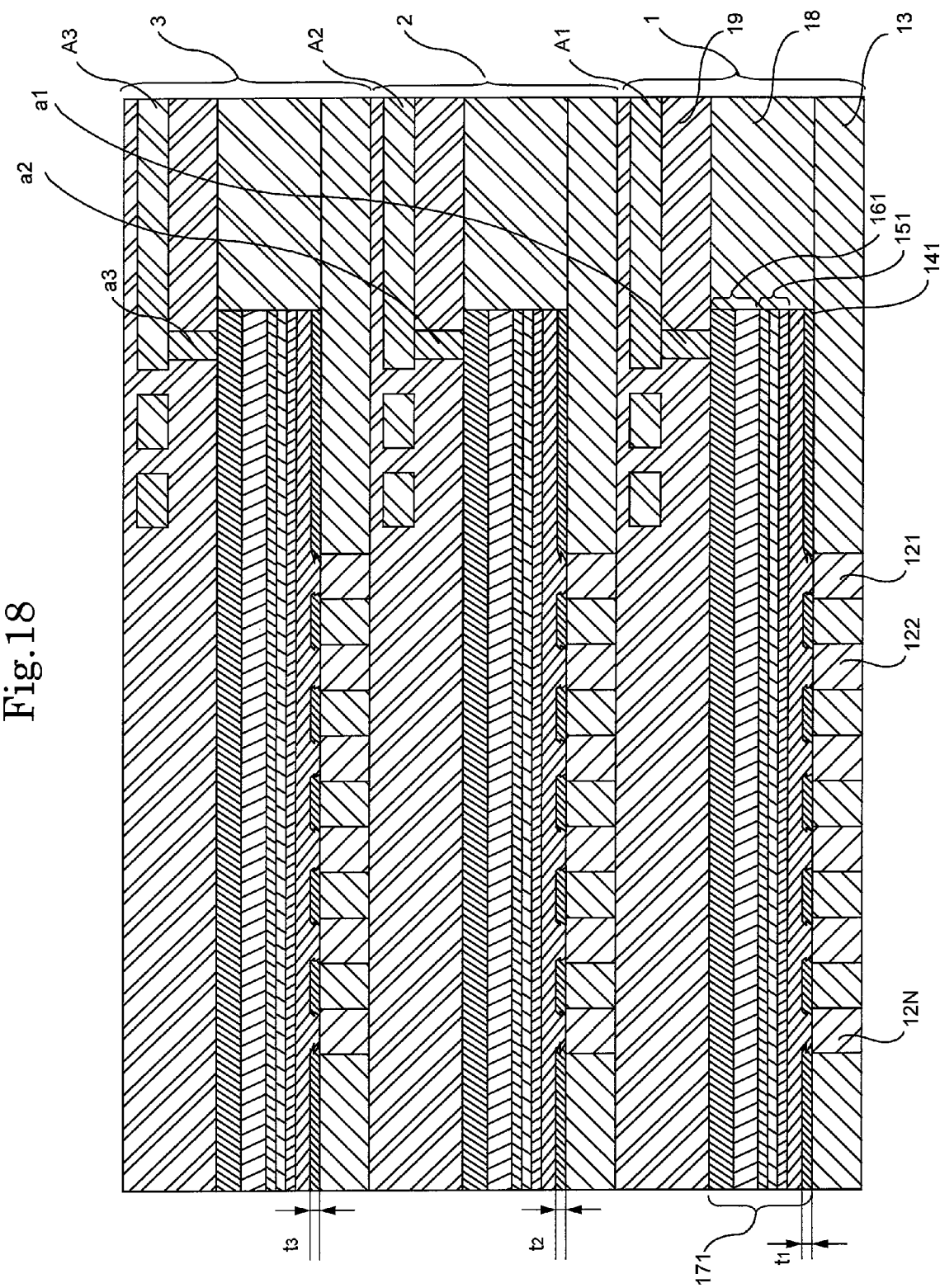
FIG. 18 is a schematic sectional view showing an example of the process, in which the thin film transistors of a plurality of layers of Embodiment 4 according to the present invention are formed.

The semiconductor of Embodiment 4 is configured, as shown in FIG. 18, by the thin film transistor 1 which configures Embodiment 2 which is laminated and densified. The thin film transistors existing above the first layer position are formed by repeating the manufacturing process of the semiconductor device of Embodiment 2. The thin film transistors 2 of the second layer position and the third thin film transistors 3 of the third layer position are formed on the thin film transistor 1 in turn. Thus, the desired number of three-dimensional lamination memory device may be formed, as shown in FIG. 18.

Figure 19:
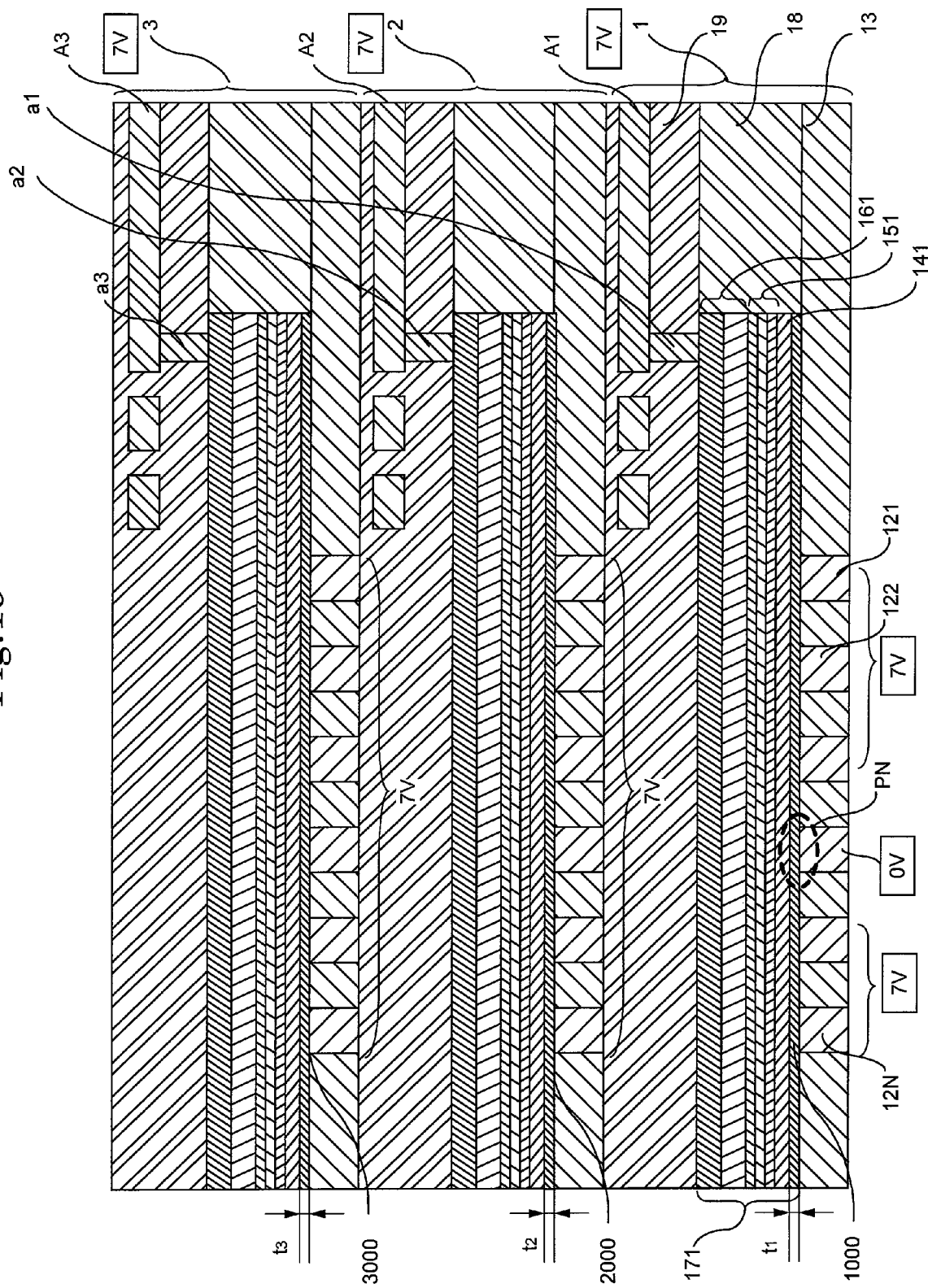
FIG. 19 is a schematic sectional view showing an example of the process, in which dielectric breakdown is performed to the impurity diffusion control films between the source/drain regions and the channel layer of the channel/gate layers.

In addition, the process in which dielectric breakdown of the impurity diffusion control film is performed, is the same as Embodiment 2, as shown in FIG. 19. For instance, approximately 7 V is applied to the gate electrodes of the thin film transistors of each layer from the electrode wirings A1 to A3 via the electrode wirings a1 to a3 as shown in FIG. 19. The potential of the source/drain region forming the impurity diffusion control film which is an object for dielectric breakdown thereon, is adjusted to 0 V. The rest of the source/drain regions are biased to be approximately 7 V.

By selecting the source/drain regions in turn and performing the above-described dielectric breakdown process, the impurity diffusion control films lying between the source/drain regions and channel layers of thin film transistors in the all layers are broken down, and thus, pn junctions are formed. By the dielectric breakdown process, the semiconductor of Embodiment 3 shown in FIG. 18 may perform a thin film transistor operation and a memory operation normally.

Embodiment 5

With the process similar to Embodiment 1, the source/drain regions are formed and manufactured in the shape of wiring, and then the interlayer film is filled and leveled. After these processes, each upper surface of the source/drain regions is nitridation, and thus the impurity diffusion control films are formed with a nitride film (SiN) within the range of approximately 0.5 nm to 2.0 nm. Impurities of the channel layers are injected so that the impurities of the source/drain region are diffused. The amount of impurities which are diffused into the channel layer changes depending on the heat added. As the head added increases so does the amount of impurities. Thus, the impurity diffusion control films are formed to become a constant film thickness so that the impurities that are diffused into the channel layers fit within a constant field. At the same time, on the other hand, the impurity diffusion control films are formed so that an ohmic contact may be formed between the source/drain regions and the channel layers after finishing the semiconductor device manufacturing process and that current be passed. Each film thickness of the impurity diffusion control films is required to be changed corresponding to added heat. However, if the film thicknesses are formed in a range of approximately 0.5 nm to 2.0 nm, the impurities diffused into the channel layers are fit in a constant range, and the ohmic contact may be formed. In addition, with the process similar to Embodiment 1, the impurity diffusion control films may be formed by a method for depositing the nitride film (SiN) on the S/D regions 121 to 12N and the interlayer film 13. Next, with a process similar to Embodiment 1 or Embodiment 3, a channel/gate layer is formed.

Figure 20:
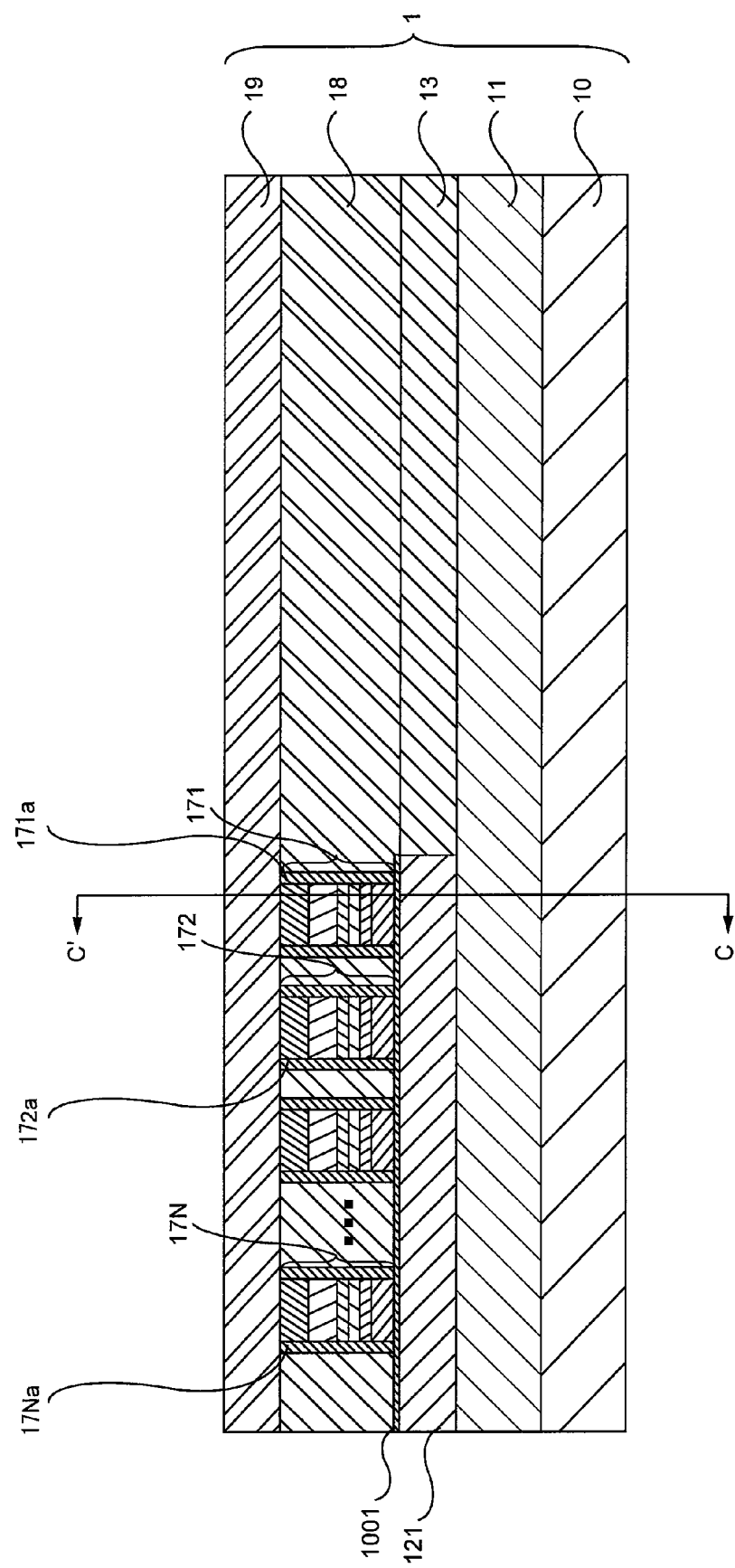
FIG. 20 is a schematic sectional view showing an example of the semiconductor device of Embodiment 5 according to the present invention.
Figure 21:
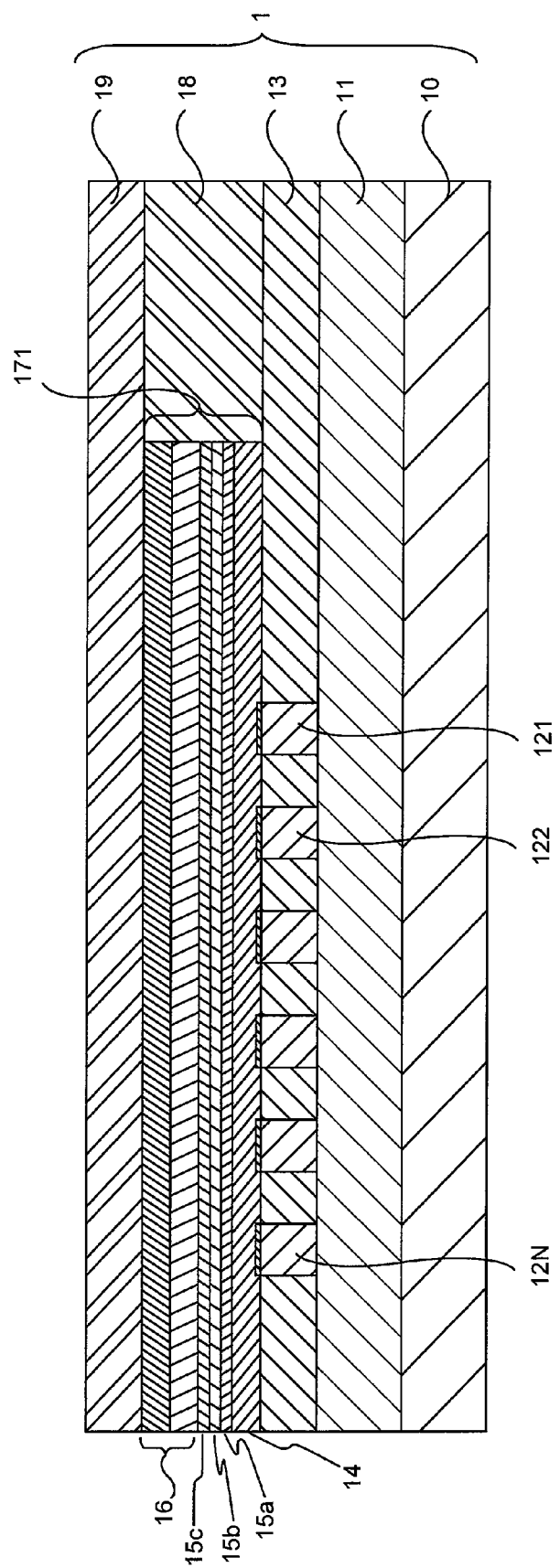
FIG. 21 is a schematic sectional view of a C-C' line shown in FIG. 20.

FIG. 20 is a schematic sectional view showing the semiconductor device of Embodiment 5 according to the present invention. FIG. 21 is a schematic sectional view when a section of the semiconductor device shown in FIG. 20 is seen from the channel/gate layer 171 side to a direction of 17N side. Points where the semiconductor device of Embodiment 5 differs from that of Embodiments 1 to 4 are that the film thickness of impurity diffusion control film 1001 formed between the source/drain regions and the channel layers is formed thinly in a constant range, and a nitride film is used as a material of the impurity diffusion control film. In the case of the semiconductor device of Embodiment 5, the impurity diffusion control film does not function to shut off the impurities diffused from the source/drain regions to the channel layers. The film thickness of the impurity diffusion control film is formed thinly so that the diffusion amount of impurities maybe constantly controlled. Anitride film for the material is used. Thereby, it is possible to control the diffusion amount of n-type impurities from the source/drain regions to the channel layers to a desired diffusion length in a desired temperature in the stage of heat addition in a semiconductor manufacturing process, even though pn junctions are not formed between the source/drain regions and the channel layers. At the time of completing the semiconductor manufacturing process, the ohmic contact may be formed between the source/drain regions and the channel layers, and further current may be passed. Also, unlike the above-described Embodiments 1 to 4, a process in which dielectric breakdown is performed to the impurity diffusion control film 1001 may be omitted.

Embodiment 6

With a process similar to Embodiment 1 or Embodiment 3, the source/drain regions are formed and manufactured in the shape of wiring, and then the interlayer film is filled and leveled. After these processes, impurity diffusion control film of the film thickness t, is formed on each upper surface of the source/drain regions or the whole upper surfaces of the source/drain regions and the interlayer film. Subsequently, the channel/gate layers are formed, and thus, the thin film transistors at the bottom layer are manufactured.

Next, with a process similar to Embodiment 2 or Embodiment 4, a plurality of thin film transistors are formed in the upper layer of the thin film transistor which is on the lowest layer. The impurity diffusion control film of the Nth (N is an integer) layer thin film transistor is formed so that the film thickness TN is relatively thinner than the film thickness of the impurity diffusion control film of the lower transistor. For instance, the impurity diffusion control film is formed as silicon nitride within a range of approximately $0.5 \leq t_N < \ldots < t_2 \leq t_1 \leq 2.0$ nm. The impurity diffusion control film is formed the same as Embodiment 1 and Embodiment 3 except in the point described above.

Figure 22:
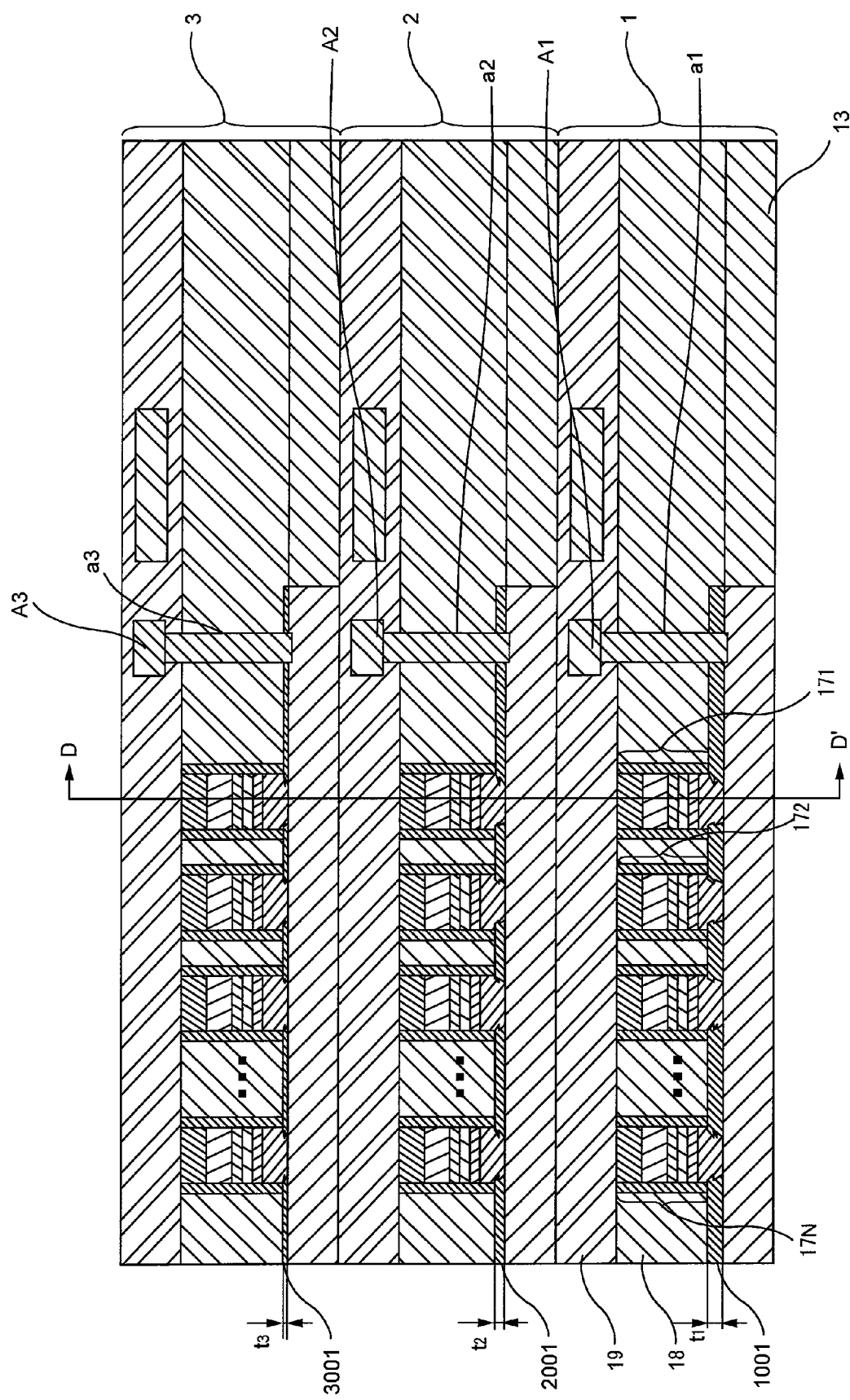
FIG. 22 is a schematic sectional view showing an example of the semiconductor device of Embodiment 6 according to the present invention.
Figure 23:
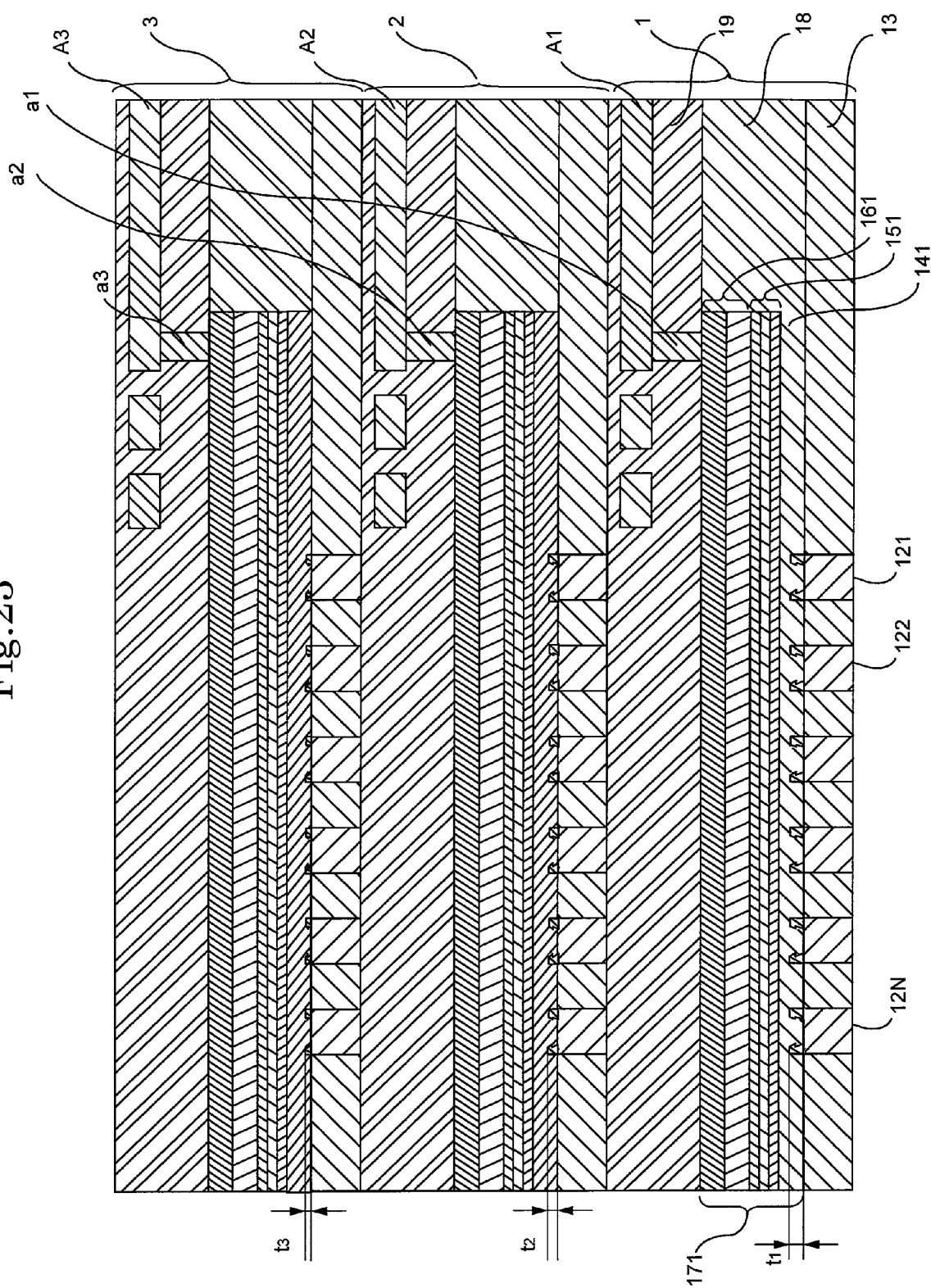
FIG. 23 is a schematic sectional view of a D-D' line shown in FIG. 22.

FIG. 22 is a schematic sectional view showing a semiconductor device which forms a plurality of thin film transistor of Embodiment 6 according to the present invention. FIG. 23 is a schematic sectional view, in which the thin film transistor of Embodiment 6 is seen from the channel/gate side 171 to the source/drain regions 121 to 12N in a parallel direction. The semiconductor device, in which a plurality of thin film transistors of Embodiment 6 according to the present invention shown in FIG. 22 and FIG. 23, has a three-layer structure. The film thickness $t_2$ of the impurity diffusion control film 2001 of the thin film transistor at a second layer position is formed so that $t_2$ is thinner than the film thickness $t_1$ of the impurity diffusion control film 1001 of the thin film transistor at the bottom layer. Similarly, the film thickness $t_3$ of the impurity diffusion control layer 3001 of the thin film transistor at the top layer position is formed so that $t_3$ is thinner than the film thickness $t_2$. In other words, the thickness of the impurity diffusion control film formed at the upper layer is thinner than that at the lower layer. When a plurality of thin film transistors are laminated and densified, thermal budgets are respectively different between the thin film transistor at the upper layer and the thin film transistor at the lower layer. In other words, transistors at the lower layer position are affected by the heat process in the manufacturing process of thin film transistor at the upper layer position, and transistors at the upper layer position are less affected by the heat process in the manufacturing process of thin film transistors at the further upper layer position.

Therefore, when the semiconductor device is configured by laminating the thin film transistors from a first layer position, and in turn a second layer position, a third layer position, and so on, the impurity diffusion control films formed at each layer are sequentially and gradually thinned. Hereby, it becomes possible to control the diffusion length of impurities at each stratum to the same degree when the semiconductor manufacturing process has finally completed. Thus, unevenness of the thin film transistor characteristics of each layer may be reduced.

In addition, the process in which dielectric breakdown of the impurity diffusion control film is performed, is the same as Embodiment 2 and embodiment 4. For instance, approximately 7 V is applied to the gate electrodes of the thin film transistors of each layer from the electrode wirings A1 to A3 via the electrode wirings a1 to a3 in FIG. 23. The potential of the source/drain region forming the impurity diffusion control film which is an object for dielectric breakdown thereon, is adjusted to 0 V. The rest of the source/drain regions are biased to be approximately 7 V.

By selecting the source/drain regions in turn and performing the above-described dielectric breakdown process, the impurity diffusion control films lying between the source/drain regions and channel layers of thin film transistors in all the layers are broken down, and thus, pn junctions are formed. By the dielectric breakdown process, the semiconductor of Embodiment 6 shown in FIG. 22 and FIG. 23 may perform a thin film transistor operation and a memory operation normally.

Embodiment 7

With a process similar to Embodiment 1 or Embodiment 3, the source/drain regions are formed and manufactured in the shape of wiring, and then the interlayer film is filled and leveled. After these processes, impurity diffusion control films are formed on each upper surface of the source/drain regions or the whole upper surface of the source/drain regions and the interlayer film. Subsequently, the channel/gate layer is formed with a process similar to Embodiment 1 and Embodiment 3 except that the channel layer is configured using polysilicon which includes impurities of the same type as the impurities included in the S/D regions. The thin film transistor manufactured by this manufacturing process is that of a normally-on depression type, in which ON appears in a normal state and the channel layer be in an entirely depletion state and thus becomes OFF when the gate electrode is set to a minus side.

Also in this embodiment, to alter a threshold, it is required that the impurity diffusion control films are formed between the source/drain regions and the channel layer so that the n-type impurities are not diffused.

In this embodiment, after completing the process, the dielectric breakdown is performed by adding high electric field into spaces between each source/drain region and the channel layer. Thus, pn junctions may be formed. The semiconductor device of Embodiment 7 manufactured by the above manufacturing process is the device in which the semiconductor device of Embodiment 1 or Embodiment 3 are configured with a thin film transistor of the normally-on depression type Embodiment 8

With a process similar to Embodiment 1 or Embodiment 3, the source/drain regions are formed and manufactured in the shape of wiring; and then the interlayer film is filled and leveled. After these processes, impurity diffusion control films are formed on each upper surface of the source/drain regions or the whole upper surface of the source/drain regions and the interlayer film. Subsequently, the channel/gate layer is formed with a process similar to Embodiment 2 or Embodiment 4, except that the channel/gate layer is configured using polysilicon including impurities which are the same type as impurities included in the S/D region, and thus, thin film transistors of a plurality of layers are manufactured in turn. The thin film transistor manufactured by this manufacturing process is that of a normally-on depression type, in which ON appears in a normal state and the channel layer be in an entirely depletion state and thus becomes OFF when the gate electrode is set to a minus side.

The semiconductor device of Embodiment 8 manufactured by the above manufacturing process is the device, in which the semiconductor device of Embodiment 2 or Embodiment 4 is configured to a thin film transistor of normally-on depression type.

Embodiment 9

With a process similar to Embodiment 5, the source/drain regions are formed and manufactured in the shape of wiring; and then the interlayer film is filled and leveled. After these processes, impurity diffusion control films are formed on each upper surface of the source/drain regions. Subsequently, the channel/gate layer is formed with a process similar to Embodiment 5 except that the channel layer is configured using polysilicon including impurities which are the same type as the impurities included in the S/D regions. Thus, thin transistors of a plurality of layers are manufactured in turn. The thin film transistors manufactured by this manufacturing process are that of a normally-on depression type, in which ON appears in a normal state and the channel layer be in an entirely depletion state and thus becomes OFF when the gate electrode is set to a minus side.

Then, the semiconductor device of Embodiment 9 manufactured by the above manufacturing process is the device, in which the semiconductor device of Embodiment 5 is configured to a thin film transistor of normally-on depression type.

As described above, the semiconductor device and the manufacturing method thereof are explained by the Embodiments 1 to 9, however, the semiconductor device and the manufacturing method thereof is not particularly limited to Embodiments 1 to 9, and various kinds of changes are possible.

According to the first feature of one embodiment of the present invention, the semiconductor device provides a configuration of: a source/drain region including impurity that is formed on the semiconductor substrate via an insulating layer;
an insulator filling a space of the source/drain regions;
an impurity diffusion control film layer formed on the source/drain region;
a channel layer formed on the impurity diffusion control film to cross at a right angle towards a direction where the source/drain region is extended;
a gate insulating film formed on the channel layer;
a gate electrode formed on the gate insulating film;
an interlayer film formed of insulators formed to fill the channel layer, the gate insulating film and the gate electrode, in which the impurity diffusion control film between the source/drain region and the channel layer are broken, and electrically connected.

According to the second feature of one embodiment of the present invention, an impurity diffusion control film is formed between the source/drain regions and the channel layer; thus, it becomes possible to limit or control diffusion of impurity from the source/drain regions toward the channel layer. Therefore, unevenness of characteristics of the thin film transistor may be reduced so that a functionally stable semiconductor device may be provided.

According to the third feature of one embodiment of the present invention, the gate insulation film formed on the channel layer is considered as a lamination structure including: a three-layer of a first insulating layer; an electric charge accumulating layer; and a second insulating layer.

According to the fourth feature of one embodiment of the present invention, the lamination structure including: a three-layer of a first insulating layer; an electric charge accumulating layer; and a second insulating layer is provided and set to be a MONOS structure. Thus, the thin film transistor may be used as a non-volatile memory cell. As described above, it becomes possible to limit or control diffusion of impurity from the source/drain regions toward the channel layer due to the formation of impurity diffusion control film between the source/drain regions and the channel layer. Thus, a non-volatile semiconductor memory device having memory cells in which unevenness of characteristics (threshold) of the thin film transistors is reduced may be provided.

According to the fifth feature of one embodiment of the present invention, a plurality of the thin film transistors are laminated, and the film thickness of the impurity diffusion control film at the upper layer is formed to become a film thickness not more than that of the impurity diffusion control film at the lower layer.

According to the sixth feature of one embodiment of the present invention, the film thickness of impurity diffusion control film of the thin film transistors at the lower layer side are formed thick and the impurity diffusion control film of the thin film transistors at the upper layer side is formed relatively thinly for the film thickness of the lower layer side. Thereby diffusion length in the thin film transistor of each layer in which thermal histories are different may be adjusted within a desired range according as thermal history. Therefore, at the time of completing the manufacturing process of semiconductor device, unevenness of the thin film transistor characteristics of each layer may be reduced and thus a functionally stable semiconductor device may be provided, even though the thermal history added to the thin film transistor of each layer is different.

According to the seventh feature of one embodiment of the present invention a manufacturing method of the semiconductor device is proposed providing steps of:
placing source/drain regions in parallel to each other and forming insulator that fill spaces between the each source/drain region;
forming impurity diffusion control films on upper surfaces of the source/drain regions;
forming a channel layer of the thin film transistor to cross at a right angle to the source/drain regions;
forming the gate insulating film on the channel layer and forming the gate electrode of the thin film transistor on the gate insulation film;
performing dielectric breakdown of the impurity diffusion control films by applying predetermined voltages to the source/drain regions and the gate electrode respectively, and forming pn junction from (each of) the source/drain regions to (each of) the channel layer.

According to the eighth feature of one embodiment of the present invention, in the process where thermal history is added, diffusion of impurities from the source/drain regions to the channel layers are limited or controlled by the impurity diffusion control film. In the later processes, dielectric breakdown is performed on the impurity diffusion control film, and then pn junction is formed. Therefore, a manufacturing method may be provided, in which characteristics of the thin film transistors of each of the layers where thermal history is different is made equal.

According to the ninth feature of one embodiment of the present invention a manufacturing method of the semiconductor device is proposed providing steps of:
placing the source/drain regions in parallel to each other and thus forming insulator filling spaces between the each source/drain regions;
forming impurity diffusion control films including nitride film of approximately 0.5 nm to 2.0 nm on the upper surfaces of the source/drain regions;
forming a channel layer of the thin film transistor to cross at a right angle to the source/drain regions;
forming gate insulating film on the channel layer and forming gate electrode of the thin film transistors on the gate insulation film.

According to the tenth feature of one embodiment of the present invention, a degree of the impurity included in the source/drain may be inhibited to the predetermined field because the impurity diffusion control films are formed with a nitride film of approximately 0.5 nm to 2.0 nm. In addition, a dielectric breakdown process of the impurity diffusion control films can be omitted.

What are claimed are:

1. A semiconductor device comprising:
   a first semiconductor region and second semiconductor region including impurities formed on an insulating layer formed on a semiconductor substrate;
   an insulator formed between said first semiconductor region and said second semiconductor region;
   a channel layer formed on said first semiconductor region and said second semiconductor region, said channel layer being perpendicular to a direction in which said first semiconductor region and said second semiconductor region are extended, said channel layer including both a different type of impurities and the same type of impurities as said impurities included in said first semiconductor region and said second semiconductor region;
   a first impurity diffusion control film formed between said first semiconductor region and said channel layer, and a second impurity diffusion control film formed between said second semiconductor region and said channel layer, said first impurity diffusion control film and said second diffusion control film having thickness of 0.5 nm to 1.0 nm respectively;
   a gate insulating film formed on said channel layer; and
   a gate electrode formed on said gate insulating film.

2. The semiconductor device according to claim 1, wherein said first impurity diffusion control film and said second impurity diffusion control film are punctured, and said first semiconductor region and said channel layer and said second semiconductor region and said channel layer are electrically connected.

3. The semiconductor device according to claim 2, wherein said first impurity diffusion control film and said second impurity diffusion control film include $SiO_2$ respectively.

4. The semiconductor device according to claim 1, wherein said gate insulating film is a lamination structure having three layers of a first insulating layer, an electric charge accumulating layer and a second insulating layer.

5. The semiconductor device according to claim 1, wherein said channel layer includes polysilicon.

6. The semiconductor device according to claim 1, wherein said first and second semiconductor regions, said insulator, said first and second impurity diffusion control films, said channel layer, said gate insulating film and said gate electrode form a transistor, and wherein said transistor is a depression type.

7. The semiconductor device according to claim 1, wherein said first impurity diffusion control film and said second impurity diffusion control film include SiN respectively, and said first impurity diffusion film and said second impurity diffusion film are not punctured.

8. The semiconductor device according to claim 2, wherein said first impurity diffusion control film and said second impurity diffusion control film include SiN respectively.

* * * * *